(12) United States Patent
Ma et al.

(10) Patent No.: US 9,519,040 B2
(45) Date of Patent: Dec. 13, 2016

(54) METHODS AND APPARATUS FOR PHASE CORRECTION IN MAGNETIC RESONANCE IMAGING

(71) Applicant: Board of Regents, The University of Texas System, Austin, TX (US)

(72) Inventors: Jingfei Ma, Houston, TX (US); John Hazle, Kingwood, TX (US); Jong Bum Son, Sugar Land, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 64 days.

(21) Appl. No.: 14/677,156

(22) Filed: Apr. 2, 2015

(65) Prior Publication Data

US 2015/0316631 A1    Nov. 5, 2015

Related U.S. Application Data

(60) Provisional application No. 61/975,143, filed on Apr. 4, 2014.

(51) Int. Cl.
*G01R 33/565* (2006.01)
*G01R 33/48* (2006.01)
(Continued)

(52) U.S. Cl.
CPC ......... *G01R 33/565* (2013.01); *G01R 33/4828* (2013.01); *G01R 33/5602* (2013.01); *G01R 33/5611* (2013.01); *G01R 33/56527* (2013.01)

(58) Field of Classification Search
None
See application file for complete search history.

(56) References Cited

U.S. PATENT DOCUMENTS

| | | | |
|---|---|---|---|
| 7,227,357 B2 | 6/2007 | Werthner |
| 7,227,359 B2 | 6/2007 | Ma |
| 7,888,936 B2 | 2/2011 | Jellus |

OTHER PUBLICATIONS

Ma, "Breath-hold water and fat imaging using a dual-echo two-point Dixon technique with an efficient and robust phase-;correction algorithm," Magn Reson Med, 52(2):415-419, 2004.*

(Continued)

*Primary Examiner* — Bhavesh Mehta
*Assistant Examiner* — Menatoallah Youssef
(74) *Attorney, Agent, or Firm* — Parker Highlander PLLC

(57) ABSTRACT

Methods, apparatuses, systems, and software for extended phase correction in phase sensitive magnetic resonance imaging utilizing an optimized region-growing based phase correction algorithm. Phase correction is formulated as selecting a vector for each pixel of an image from two input candidate vectors so that the orientation of the output vector is spatially smooth. In certain embodiments, the optimized region growing algorithm uses automated quality guidance for determining the sequence of region growing and jointly considers the two input candidate vectors during region growing. Further, the algorithm tracks the quality and the mode at each step of the processing. Spatially isolated tissue regions are automatically segmented and processed with different threads of region growing and the correct vector is reliably identified as the output vector for each thread of region growing. Final phase correction was performed by pixel level optimization.

21 Claims, 25 Drawing Sheets

(51) Int. Cl.
    *G01R 33/561*     (2006.01)
    *G01R 33/56*     (2006.01)

(56) References Cited

OTHER PUBLICATIONS

Ma, "Two-point Dixon imaging with flexible echo times and a region growing-based postprocessing algorithm," Proc. Inti. Soc. Mag. Reson. Med., 19:2707,2011.*

Berglund et al., "Two-point Dixon method with flexible echo times," *Magn. Reson. Med.*, 65(4):994-1004, 2011.

Eggers et al., "Dual-echo Dixon imaging with flexible choice of echo times," *Magn. Reson. Med.*, 65(1):96-107, 2011.

Eggers et al., "Dual-echo Dixon imaging with unrestricted choice of echo times," *Proc. Intl. Soc. Mag. Reson. Med.*, 18:770, 2010.

Eggers, "Influence and compensation of fat signal dephasing and decay in two-point Dixon imaging," *Proc. Intl. Soc. Mag. Reson. Med.*, 18:2924, 2010

Ma et al.,"Fat-suppressed three-dimensional dual echo Dixon technique for contrast agent enhanced MRI," *J. Magn. Reson. Imaging*, 23(1):36-41, 2006.

Ma, "Breath-hold water and fat imaging using a dual-echo two-point Dixon technique with an efficient and robust phase-correction algorithm," *Magn. Reson. Med.*, 52(2):415-419, 2004.

Xiang, "Two-point water-fat imaging with partially-opposed-phase (POP) acquisition: an asymmetric Dixon method," *Magn. Reson. Med.*, 56(3):572-584, 2006.

* cited by examiner

METHODS AND APPARATUS FOR PHASE CORRECTION IN MAGNETIC RESONANCE IMAGING

CROSS-REFERENCE TO RELATED APPLICATIONS

This application claims priority to U.S. Provisional Patent Application Ser. No. 61/975,143 filed Apr. 4, 2014, the entire contents of which are incorporated herein by reference.

BACKGROUND

Field of the Invention

The present invention relates generally to the field of medical imaging. More particularly, embodiments of the invention relate to phase sensitive magnetic resonance imaging (MRI) using an optimized region growing algorithm for phase correction that includes an automated quality guidance and joint consideration of two possible solutions at each step of region growing and automated segmentation of spatially isolated tissues during region growing.

Description of Related Art

MRI has proven useful in the diagnosis of many diseases such as hepatic steatosis, cancer, multiple sclerosis, sports related injury, and bone marrow disorders. MRI provides unique imaging capabilities that are not attainable in any other imaging method. For example, MRI can provide detailed images of soft tissues, abnormal tissues such as tumors, and other structures that cannot be readily imaged using techniques like X-rays. Further, MRI operates without exposing patients to ionizing radiation experienced in X-rays. For these and other reasons, MRI is commonly utilized in medical and other fields.

In comparison to other imaging modalities, MRI is unique in that an MRI signal is represented by a complex number, rather than simply a scalar (such as X-ray attenuation in Computed Tomography). The image value for each image pixel, therefore, usually includes a magnitude and a phase. Although the phase of an image pixel may carry important information and may be used in many applications such as chemical shift imaging, thermal imaging, and blood flow quantification, it is usually discarded in a standard image reconstruction process. An underlying reason is that some unwanted background or error phase almost always accompanies the desired phase.

One application for phase correction of MR images includes inversion recovery imaging. Inversion recovery (IR) is generally used as a magnetization preparation technique in MRI. In IR imaging, a longitudinal magnetization along a main magnetic field is first rotated to the opposite direction using a 180 degree radiofrequency (RF) pulse. The inverted magnetization returns to the magnetic field direction by T1 relaxation during an inversion time (TI) between the inversion and the excitation RF pulse. One example application of IR imaging is for suppression of a given type of tissue with a characteristic T1, such as short-tau inversion recovery (STIR) for fat suppression or fluid-attenuated inversion recovery (FLAIR) for cerebral spinal fluid attenuation. Another example application of IR imaging is for increased tissue contrast from the doubling of the dynamic range of the longitudinal magnetization. The latter application could be useful for imaging of neonate brains, myocardium at delayed enhancement, or for evaluating pulmonary blood flow.

The potential for increased tissue contrast by IR imaging, however, is not always realized because conventional MR image reconstruction preserves only the magnitude of the MR signals and may actually lead to reduced or even reversed contrast in an IR image.

Phase-sensitive IR (PSIR) image reconstruction, in which unwanted background or error phase in an IR image is removed, is a technique that can restore the contrast loss or reversal resulting from conventional magnitude image reconstruction. One challenge in PSIR image reconstruction is a phase-correction process to separate the intrinsic signal phase in the complex image from the background or error phase, which is almost unavoidable in an MR image. Several approaches have been proposed for PSIR image reconstruction including calibration of the phase errors through acquisition of another image without IR or with IR at different TIs. However, these approaches reduce data acquisition efficiency. Further, spatial mis-registration between the actual and calibration scans due to patient motion can also be problematic.

An alternative approach for PSIR image reconstruction is to determine the background or error phase from the IR image itself using various phase correction algorithms. In general, only the signal phase of a neighbor pixel for overall phase correction is used in many of these phase correction algorithms. As such, pixels with large phase variation, such as in regions of low signal-to-noise ratio (SNR) or along tissue boundaries may corrupt the phase correction process. In order to minimize the effect, an empirical threshold is usually selected to exclude regions of large phase uncertainty. The actual threshold value, however, can be critical. If the value selected is too small, phase correction cannot reach beyond the regions defined by the threshold value and may thus be terminated prematurely. Alternatively, if the value selected is too large, errors in phase correction may propagate and even corrupt the rest of the process. In a region growing-based approach, for example, the selection of the threshold value together with that of the initial seed and the path of the region growing, determines the quality and the scope of the phase correction. To allow phase correction to proceed beyond local phase fluctuations and to avoid potential corruption due to phase correction errors, an additional ad hoc treatment, such as a "bridge filter" is required. Another limitation of the phase correction algorithms is the global polarity of a PSIR image, which cannot be unambiguously determined from the phase correction process itself. Consequently, images from different component channels of a phased array coil cannot be readily combined and inconsistency in display may arise for different images of a multi-slice acquisition.

Another phase sensitive MRI application where correction of phase errors may be important is the Dixon chemical shift imaging technique. In MRI, the signal-emitting protons may resonate at different Larmor frequencies because they have different local molecular environments or chemical shift. The two most distinct species found in the human body are water and fat, whose Larmor frequencies are separated by about 3.5 ppm (parts per million). In many clinical MRI applications, it is desirable to suppress signals from fat because they are usually very bright and obscure lesions. Presently, a commonly used method for fat suppression is chemical shift selective saturation (CHESS), which, despite its many advantages, is known to be intrinsically susceptible to both radiofrequency (RF) and magnetic field inhomogeneity. Another technique that is sometimes used for fat suppression is the short tau inversion recovery (STIR), which is based on the characteristically short T1 relaxation constant for fat, rather than on its Larmor frequency. The drawbacks of STIR include reduction in scan efficiency and signal-to-noise ratio as well as potential alteration to the image contrast.

In U.S. Pat. No. 7,227,359 (the '359 patent) and Magn. Reson. Med. 52:415, 2004, both incorporated herein by reference, one of the present inventors described, among other things, region growing based phase correction methods for phase sensitive MRI using a region growing phase correction algorithm. Potential applications for such methods include a two-point Dixon method for water and fat imaging. In a typical two-point Dixon method, two acquired input images have water and fat relative phase angles of approximately 0° (in phase) and approximately 180° (opposed phase), respectively. This restriction of relative phase angles, in turn, imposes certain restrictions on corresponding echo times that are used for acquiring input images.

In some instances, there may be certain limitations of the algorithm disclosed in the '359 patent that may affect its performance. For example, the algorithm of region growing seeks to determine only the correct phase vector solution and ignores the other incorrect phase vector solution at each step of the region growing. This may not have the optimal performance for reliability as useful information contained in the incorrect phase vector solution is not used. Second, a single initial seed pixel is used in the region growing process. As a result, failure in the processing of one pixel may lead to failure in the processing of many subsequent pixels. This can be particularly problematic when there are regions of tissues that are seemingly disconnected (e.g., in an axial image of two legs, or in the axial image running across the dome of the liver). In such cases, region growing needs to cross over regions of complete noise or of a very low signal-noise ratio, making the subsequent processing of a tissue region unreliable.

In the article Xiang, Magnetic Resonance in Medicine 56:572-584, 2006, which is incorporated herein by reference, Xiang proposed that it is possible to do water and fat imaging using two input images acquired at more flexible echo times (e.g., phases that are not substantially equal to 0° and 180°). In that article, Xiang discussed an iterative phase correction method and demonstrated water and fat imaging using an input image that is in phase and another input image that has a more flexible phase. Xiang called the iterative phase correction method RIPE, which stands for Regional Iterative Phasor Extraction. RIPE fundamentally relies on a global convergence of local statistical iterations of different phasor candidates in different regions of an image. Potential limitations of the approach include a requirement for prior image thresholding to successfully exclude low signal-to-noise regions. The RIPE approach may also run into difficulties when two input images are substantially in-phase and substantially 180° out-of-phase, or when regions of large artifacts (e.g., near metallic implants) are present to create an incorrect initial bias for the phasor iterations. Further, the fat signal is modeled as a single spectral resonance with no attenuation as a function of the echo time in Xiang's 2006 Magnetic Resonance in Medicine 56:572-584 implementation of the RIPE approach for two-point Dixon imaging. Finally, Xiang's algorithm, like all previously known phase correction algorithms, considers only the correct phase vector for each pixel.

More recently in Eggers et al, abstract p. 770 and abstract p. 2924, 2010 Annual Scientific Meeting of the International Society of Magnetic Resonance in Medicine, and Magnetic Resonance in Medicine 65(1):96-107, 2011, which are incorporated herein by reference, Eggers et al. reported that by using the RIPE method, two input images can both be relaxed to have flexible phases that are substantially different from in-phase and substantially different from 180° out-of-phase. Further, the fat signal model is extended to include up to 7 separate spectral resonance peaks, which are determined from measurements using magnetic resonance spectroscopy.

The increased flexibility associated with the use of images having echo times that are more flexible than being substantially in-phase and substantially 180° out-of-phase can reduce some restrictions of scan parameters and further improve the scan efficiency for techniques such as dual-echo acquisition. This flexibility, however, also adds additional variables and complexity to phase error calculations that were not considered in previous algorithms. For example, in the above-referenced publications both by Xiang and by Eggers et al., the important step of phase correction in post-processing images with flexible echo times has—prior to embodiments of the present disclosure—been based on a statistical iterative process that is named RIPE by Xiang. This process involves empirical image thresholding to exclude low signal-to-noise regions. The process may also run into difficulties when two input images are substantially in-phase and substantially 180° out-of-phase, or when regions of large artifacts (e.g., near metallic implants) are present to create an incorrect initial bias for the phasor iterations. Furthermore, modeling of the fat signal by Eggers et al. is based on measurement using magnetic resonance spectroscopy that can only account for limited number of spectral peaks and cannot account for other confounding factors such as magnetic field strength, pulse sequence and scan parameters used, and potentially different relaxation times for the different spectral peaks. Finally, phase correction used by Xiang and by Eggers et al, and in fact by all the other known methods is based on selecting a single optimal solution for phase error from a set of possible solutions for each image pixel. Such an approach can be extremely challenging and prone to errors in the presence of large noise or artefacts. Embodiments of the present disclosure relate generally to alternative post-processing strategies for phase sensitive magnetic resonance imaging. When applied to two point Dixon imaging, certain embodiments of the present disclosure use a generalized signal model for fat and feature a particular type of optimized region-growing scheme that accounts for additional complexities, without a need for image thresholding or a statistical iterative processing. Further, the disclosed optimized region growing scheme may naturally encompass input images that are acquired substantially in-phase and substantially 180° out-of-phase, and is not affected by the presence of regions with large image artifacts. Using this post-processing strategy, successful water and fat separation can be accomplished with, for example, phantom and in vivo images by a three-dimensional dual-echo acquisition with flexible echo times. Post-processing strategies of the present disclosure can also be directly applied to other useful applications such as, but not limited to, phase sensitive inversion recovery image, single point Dixon imaging, and single point silicone-specific imaging. In general, embodiments of this disclosure provide, in part, a new optimized region growing algorithm that is able to correct background or error phase in acquired magnetic resonance image or images.

Referenced shortcomings of some existing or traditional approaches to phase sensitive MRI are not intended to be exhaustive, but rather are among many that tend to impair the effectiveness of previously known techniques concerning image reconstruction; however, those mentioned here are sufficient to demonstrate that the methodologies appearing in the art have not been satisfactory and that a need exists for techniques described and claimed in this disclosure.

SUMMARY OF THE INVENTION

Certain shortcomings of the prior art may be reduced or eliminated by some or all of the techniques disclosed here. These techniques are applicable to a vast number of MRI applications, including but not limited to any such application involving two-point Dixon imaging techniques with flexible echo times.

Recent technical advances have enabled clinical use of two-point Dixon water and fat imaging. However, a fundamental difficulty still exists in the essential step of phase correction when regions of large noise, artefacts, or isolated tissues are present. Exemplary embodiments of the present disclosure include a novel optimized region growing algorithm to help overcome this difficulty. Additionally, the present disclosure embodies a novel phase correction approach in which a set of optimal solutions for phase error are jointly selected from a set of possible solutions. Compared to the previously known approaches of phase correction, the new approach is analogous to "walking with two legs, as opposed to walking with a single leg", and therefore is much more stable and robust. Successful application of the algorithm is demonstrated in processing in vivo two-point Dixon images with flexible echo times.

Exemplary embodiments include a computerized method for generating a phase corrected magnetic resonance image comprising: (a) acquiring a first magnetic resonance image containing error and intrinsic phase information; (b) calculating two or more candidate input vector images from the acquired image; and (c) performing an optimized region growing based phase correction algorithm to determine an output vector image that is spatially smooth in orientation and is substantially represented at each pixel by one of the calculated vector images at the same pixel. In certain embodiments, phase correction is performed by: selecting an initial seed pixel for a new thread of region growing and placing the initial seed pixel onto a highest priority pixel stack; selecting a pixel that is placed on a pixel stack with a highest priority order from a list of pixel stacks that hold unprocessed pixels; determining an updated vector pair for the selected pixel by jointly considering its input vector pair (A and B) with a reference vector pair ($A_r$ and $B_r$); placing each of neighboring pixels of the selected pixel onto one of pixel stacks according to a quality metric by jointly comparing an input vector pair of a neighbor pixel with a reference vector pair; recording and monitoring the priority and the mode of region growing for the selected pixel; using the recorded mode of region growing to determine which vector pairs need to be considered and which vector of the updated vector pair is a correct vector; and performing a pixel-level optimization to correct phase correction mistakes at the pixel level.

In particular embodiments, the method further comprises: using the recorded priority to detect and segment spatially isolated tissue regions; and starting a new thread of region growing with a new initial seed pixel. In some embodiments, performing a pixel-level optimization to correct phase correction mistakes at the pixel level comprises: calculating a first candidate input vector map A and a second candidate input vector map B from the first magnetic resonance image; generating an updated vector pair (A and B) for a given pixel jointly by comparing the angular differences of A and B, B and $\tilde{A}$, $\tilde{B}$ and A, of a given pixel with a reference vector pair ($A_r$ and $B_r$) for the same pixel; deciding the order by which a pixel is visited by the region growing using a quality metric based on the angular differences of A and B, B and $\tilde{A}$, $\tilde{B}$ and A, of the pixel with a reference vector pair ($A_r$ and $B_r$) for the same pixel; calculating the reference vector pair ($A_r$ and $B_r$) for a given pixel as the updated vector pair A and B averaged over all the pixels that have been previously processed by the region growing and are located within a boxcar neighborhood of the given pixel; determining the mode of region growing by recording and monitoring the number of pixels selecting each of the three possible vector pairs (A and B, $\tilde{B}$ and A, B and $\tilde{A}$) as their updated vector pair A and B, wherein $\tilde{A}$ is the mirror vector of A with respect to B and $\tilde{B}$ is the mirror vector of B with respect to A; using the mode of region growing to select the correct vector O from the updated vector pair A and B; and detecting spatially isolated tissue regions and starting new threads of region growing by recording and monitoring the quality of region growing.

In specific embodiments, the method further comprises: performing a final pixel-level optimization in which a vector O of a pixel is assigned as its original input vector A or B depending on if A or B has a smaller angular difference with the locally average O of the pixel over a selected boxcar.

Exemplary embodiments include a computerized method for generating a phase corrected magnetic resonance image comprising: (a) acquiring a first magnetic resonance image containing error and intrinsic phase information; (b) calculating two candidate vector images A and B from the acquired magnetic resonance image; (c) generating an updated output vector pair A and B by performing an optimized region growing phase correction algorithm; and (d) performing a pixel-level optimization to determine an optimal output vector O for each pixel.

In certain embodiments, the method further comprises: (e) generating the phase corrected magnetic resonance image or images from the acquired magnetic resonance image or images using a final output vector O to remove the error phase; and (f) displaying or archiving the phase corrected magnetic resonance image or images. Particular embodiments further comprise: (g) selecting a seed pixel or pixels and assigning A and B of the seed pixel or pixels as the updated vector pair A and B for the seed pixel or pixels; (h) selecting a second seed pixel from a pixel stack and determining its updated vector pair A and B jointly as its A and B, or B and $\tilde{A}$, or $\tilde{B}$ and A, wherein $\tilde{A}$ is the mirror vector of A with respect to B, and $\tilde{B}$ is the mirror vector of B with respect to A, depending on which of the three vector pairs has the smallest angular difference with a reference vector pair for the updated vector pair A and B of the second seed pixel; (i) determining for the second seed pixel a local quality metric for each of nearest neighbor pixels of the second seed pixel for which the updated vector pair A and B have not been determined and assigning a priority to each of the nearest neighbor pixels using the local quality metric in order to determine the sequence by which each of the nearest neighbor pixels is to be selected as a further seed pixel; and (j) repeating the steps of (h) and (i) to complete optimized region growing with respect to further seed pixels and to construct the updated vector image pair A and B for all pixels that are processed by the optimized region growing.

In particular embodiments, an initial seed pixel or pixels are placed onto a high priority pixel stack or stacks among a series of pixel stacks that are initially empty and which facilitate a sequencing of the optimized region growing. In some embodiments, a pixel is selected as a seed pixel if it has not been processed previously as a seed pixel and it is on a pixel stack that has a highest priority among pixel stacks that contain at least one pixel that has not been processed as a seed pixel. In specific embodiments, the local quality metric of a pixel is calculated as the smallest of the angular differences of A and B, B and Ã, B̃ and A, of the pixel with an estimated reference vector pair $A_r$ and $B_r$ for the same pixel. In certain embodiments, the estimated vector pair $A_r$ and $B_r$ for a pixel is a first order estimation that includes an average and a linear expansion of the updated vector A and B for pixels that are located within a neighboring region of the pixel and for which the updated vector A and B have been previously determined.

In particular embodiments, the estimated updated vector A and B for a pixel is a zeroth order estimation calculated as an average of the updated vector A and B for pixels located within a neighboring region of the pixel and for which the updated vector A and B have been previously determined. In some embodiments, a size of the neighboring region is either fixed or adaptively adjusted based on a local quality metric for the pixel. In specific embodiments, a neighboring region may be conveniently defined as a boxcar in a two dimensional region growing or as a cuboid in a three dimensional region growing.

In certain embodiments, the maximum possible range of $0-\pi$ for the angular difference between any two vectors is used to gauge and bin the local quality metric and to place a pixel onto a pixel stack. In particular embodiments, the pixel stack covering a subrange of the total angular range for the quality metric is assigned a priority, and wherein a pixel stack of a higher priority is for receiving pixels with a smaller quality metric and a pixel stack of a lower priority is for receiving pixels with a larger quality metric. In some embodiments, the priority of a pixel stack from which a pixel is selected as a seed pixel is recorded for the optimized region growing as a quality metric index to reflect an integrity of the optimized region growing. In specific embodiments, the quality metric index is used to segment an image into different segments of possible inconsistent region growing and then to combine the different segments into an overall consistent region growing to form more consistent vector pair images of the updated vector pair A and B.

In certain embodiments, the values of the vector A and vector B for an initial seed pixel are assigned as the updated vector pair A and B for the initial seed pixel, and an optimized region growing is performed to jointly construct an updated vector pairs A and B for all the pixels processed by the region growing. In particular embodiments, a final correct vector O is selected by recording and monitoring the mode of region growing of the processed pixels. In some embodiments, the optimized region growing is performed in two spatial dimensions. In specific embodiments, the optimized region growing is performed in three spatial dimensions. In certain embodiments, the optimized region growing is performed by including the temporal dimension for a series of dynamically acquired images. In certain embodiments, acquiring the magnetic resonance image comprises acquiring two-point Dixon water and fat images, wherein a first image S1 is acquired at a first echo time TE1 and a second image S2 is acquired at a second echo time TE2. In particular embodiments, acquiring two-point Dixon water and fat images comprises using dual-echo bipolar readout gradients. In some embodiments, acquiring two-point Dixon water and fat images comprises using dual-echo unipolar readout gradients. In specific embodiments, acquiring two-point Dixon water and fat images comprises using triple-echo readout gradients. In certain embodiments, acquiring two-point Dixon water and fat images comprises using interleaved single echo readout gradients. In particular embodiments, selection of TE1 and TE2 is flexible except to avoid a small orientational difference between vector image A and vector image B for most imaging pixels.

In some embodiments, the images $S_1$ and $S_2$ are expressed according to the following equations:

$$S_1=(W+\delta_1 F e^{i\theta_1})P_1$$

$$S_2=(W+\delta_2 F e^{i\theta_2})P_1 P$$

where W and F are amplitudes for water and fat respectively, $P_1$ is a phase factor of image $S_1$, P is an additional phase factor of image $S_2$ relative to image $S_1$ and is determined by a background or error phase, and the method further comprises determining by an image based pre-calibration an amplitude attenuation factor ($\delta_1$, $\delta_2$) and phase ($\theta_1$, $\theta_2$) as a function of two echo times (TE1, TE2) for the fat signal. In specific embodiments, pre-calibration of ($\delta_1$, $\delta_2$) is performed in part by determining an echo time dependence of a signal amplitude of a known fat-only image region, and pre-calibration of ($\theta_1$, $\theta_2$) is performed in part by determining an echo time dependence of a phase discontinuity between a known fat-only image region and a neighboring known water-only region.

In certain embodiments, pre-calibration is performed for a given pulse sequence, a scan protocol, or a field strength. In particular embodiments, the images $S_1$ and $S_2$ are used to generate two vector images A and B as expressed according to the following equations $$A=S^*_1 S_2[Q_A+\delta_1(1-Q_A)e^{i\theta_1}]/[Q_A+\delta_2(1-Q_A)e^{-i\theta_2}]$$

$$B=S^*_1 S_2[Q_B+\delta_1(1-Q_B)e^{i\theta_1}]/[Q_B+\delta_2(1-Q_B)e^{-i\theta_2}]$$

where $Q_A$ and $Q_B$ are the two mathematically possible solutions of the following quadratic equation of Q, which is defined as $$Q = \frac{W}{W+F}$$

(i.e., the water fraction for a given pixel):

$$[(1+\delta_2^2-2\delta_2\cos\theta_2)M_1-(1+\delta_1^2 2\delta_1\cos\theta_1)M_2]Q^2-2[(\delta_2^2-\delta_2\cos\theta_2)M_1-(\delta_1^2-\delta_1\cos\theta_1)M_2]Q+[(M_1\delta_2^2-M_2\delta_1^2)]=0$$

where $M_1$ and $M_2$ are the square of the amplitudes of the images $S_1$ and $S_2$, respectively (i.e., $M_1=|S_1|^2$ and $M_2=|S_2|^2$).

In some embodiments, the vector images are further normalized and weighted by a signal amplitude, such as:

$$A' = \frac{A}{|A|}\sqrt{M_1+M_2}$$

$$B' = \frac{B}{|B|}\sqrt{M_1+M_2}$$

where again, $M_1=|S_1|^2$ and $M_2=|S_2|^2$.

In specific embodiments, an optimized region growing algorithm is used to jointly construct an updated vector image pair A and B from the two input vector images A and B and a final vector image O is selected for phase correction. In certain embodiments, a final vector image O is selected based on the region growing mode and used to phase correct and remove the phase factor P from the image $S_2$, the phase corrected $S_2$ is combined with $S_1$ to solve for $WP_1$ and $FP_1$, and then to generate a water-only image and a fat-only image according to the following equations:

$$W = \text{Real}\{(WP_1)\overline{WP_1}^*/|\overline{WP_1}|\}$$

$$F = \text{Real}\{(FP_1)\overline{FP_1}^*/|\overline{FP_1}|\}$$

where Real{ . . . } is to take the real component of its complex argument, * is to take the complex conjugate of its argument, and $\overline{WP_1}$ and $\overline{FP_1}$ represent low-pass filtering of $WP_1$ and $FP_1$, respectively.

In particular embodiments, one of the images is acquired at an echo time when water and fat are substantially in-phase, such as in a spin echo or fast spin echo pulse sequence. In some embodiments, images $S_1$ and $S_2$ are expressed according to the following equations:

$$S_1 = (W+F)P_1$$

$$S_2 = (W+\delta F e^{i\theta})P_1 P$$

where W and F are amplitudes for water and fat respectively, $P_1$ is a phase factor of image $S_1$, P is an additional phase factor of image $S_2$ relative to image $S_1$ and is determined by a background or error phase, and the method further comprises determining by an image based pre-calibration an amplitude attenuation factor $\delta$ and phase $\theta$ as a function of the echo time TE2 relative to the echo time TE1 for the fat signal.

In some embodiments, the images $S_1$ and $S_2$ are used to generate two vector images A and B as expressed according to the following equations:

$$A' = S^*_1 S_2 (W_1 + \delta F_1 e^{-i\theta})$$

$$B' = S^*_1 S_2 (W_2 + \delta F_2 e^{-i\theta})$$

where $W_1$, $F_1$ and $W_2$, $F_2$ are the two sets of algebraic solutions to the following equations:

$$I_1 = W+F$$

$$I_2^2 = W^2 + \delta^2 F^2 + 2\delta WF \cos\theta$$

where $I_1 = |S_1|$ and $I_2 = |S_2|$.

In specific embodiments, the vector images are further normalized and weighted by a signal amplitude, such as:

$$A = \frac{A'}{|A'|}(I_1 + I_2)$$

$$B = \frac{B'}{|B'|}(I_1 + I_2)$$

In certain embodiments, acquiring a magnetic resonance image or images comprises acquiring a single-point Dixon water and fat image wherein a flexible echo time TE is used and the acquired magnetic resonance image is expressed as: $S=(W+Fe^{i\theta})P$, where $\theta$ is dependent on TE and the dependence is determined with an image-based pre-calibration, and $P(\equiv e^{i\Phi})$ is a phase factor for the image S. In particular embodiments, the vector image A is set to S and the vector image B is set to $Se^{-i\theta}$. In specific embodiments, an optimized region growing algorithm is used to jointly construct an updated vector pair A and B from the two input vector images A and B, and a final vector image O is selected and used to phase correct or remove P from S to form S', and a water-only image and a fat-only image are generated according to:

$$F = \text{Imag}\{S'\}/\sin\theta$$

$$W = \text{Real}\{S' - F\cos\theta\}$$

where Real{ . . . } and Imag{ . . . } are to take the real and imaginary components of their component, respectively.

In some embodiments, acquiring a magnetic resonance image or images comprises acquiring a single-point silicone specific image wherein an echo time TE when water and fat signals are substantially in-phase is used, and the acquired magnetic resonance image is expressed according to the following equation:

$$S = (W + F + Ie^{i\theta})P$$

where $\theta$ is determined with an image-based pre-calibration for the echo time TE as a phase discontinuity of a known silicone-only image region and a neighboring known water or fat only image region, and $P(\equiv e^{i\Phi})$ is a phase factor for the image S. In certain embodiments, vector image A is set to S and vector image B is set to $Se^{-i\theta}$.

In particular embodiments, an optimized region growing algorithm is used to jointly construct an updated vector pair A and B from the two input vector images A and B, and a final vector image O is selected and used to phase correct or remove P from S to form S', and a silicone-only image and a silicone-suppressed image are generated according to:

$$I = \text{Imag}\{S'\}/\sin\theta$$

$$W + F = \text{Real}\{S' - I\cos\theta\}$$

where Real{ . . . } and Imag{ . . . } are to take the real and imaginary components of their component, respectively.

In some embodiments, acquiring a magnetic resonance image or images comprises acquiring an inversion recovery image at an inversion recovery time TI and the image is expressed according to the following equation:

$$S = Ie^{i\theta}$$

where I is a signal magnitude and $\theta$ is a measured signal phase that comprises a background or error phase and an intrinsic signal phase. In specific embodiments, vector image A is set to S and vector image B is set to −S. In certain embodiments, an optimized region growing algorithm is used to jointly construct an updated vector pair A and B from the two input vector images A and B, and a final vector image O is selected and used to phase correct the image S, and the phase corrected image S is displayed and archived as a phase sensitive inversion recovery image.

Exemplary embodiments include a system for generating a phase corrected magnetic resonance image or images comprising: (a) a magnetic resonance imaging controller; (b) a processor coupled to the controller and configured to execute phase correction instructions applicable to a magnetic resonance image or images; and (c) an output or storage device configured to display or store the phase corrected magnetic resonance image or images. In certain embodiments, the phase correction instructions comprise: (i) calculating a first input vector map A and a second input vector map B from the first magnetic resonance image; (ii) generating an updated output vector pair A and B by performing an optimized region growing phase correction algorithm; (iii) performing a pixel-level optimization to determine the optimal output vector O for each pixel; (iv) generating a phase corrected magnetic resonance image or images from the acquired magnetic resonance image or images using the final output vector O; and (v) displaying or archiving the phase corrected magnetic resonance image or images. In particular embodiments, the processor is further configured to execute phase correction instructions reflecting any of the methods disclosed herein.

Exemplary embodiments include a non-transitory computer readable storage medium with an executable program stored thereon, wherein the program instructs a microprocessor to perform steps comprising: (a) calculating a first input vector map A and a second input vector map B from a first magnetic resonance image; (b) generating an updated output vector pair A and B by performing an optimized region growing phase correction algorithm; (c) performing a pixel-level optimization to determine an optimal output vector O for each pixel; (d) selecting a final output vector O to be used for phase correction for each pixel, wherein the final output vector O is selected by using a recorded region growing mode; (e) generating a phase corrected magnetic resonance image or images from an acquired magnetic resonance image or images using the final output vector O; and (f) displaying or archiving the phase corrected magnetic resonance image or images. Certain embodiments include a non-transitory computer readable storage medium, with an executable program stored thereon, where the program further instructs a microprocessor to perform steps reflecting any of the methods disclosed herein.

Exemplary embodiments of the present disclosure include, for example, the following features: (1) using a quality guidance and multiple ordered pixel stacks to automatically determine the sequence of region growing; (2) joint consideration of both correct and incorrect phase vectors; (3) record and monitor the quality of the region growing and the mode of region growing; (4) using the recorded region growing quality to automatically segment an isolated tissue region and start a new thread of region growing to process another tissue region; (5) using the recorded region growing mode to select the correct phase vector for each thread of region growing to ensure consistency between spatially isolated tissue regions.

Embodiments of the present invention describe a novel optimized region growing algorithm for phase correction in phase sensitive MRI. Phase correction in MRI involves determination and removal of some phase-related errors in an MRI image and is an important step for successful phase sensitive MRI. Often times, phase correction requires propagating some phase related information from one location to another location in an image. In the case of isolated tissues or regions of large noise or artefacts, the "information bridge" that is used for the information propagation becomes unreliable and may not even exist. As a consequence, phase correction in different regions that are separated by complete signal void or large noise will be inconsistent. Embodiments, of the present invention address this fundamental limitation. For example, the optimized region growing algorithm records and monitors the quality of the region growing and the mode of region growing of each pixel that has been processed. Using the information, the region growing can automatically detect when it finishes processing an entire spatially connected region and is in the background noise. It can therefore start processing another spatially isolated tissue region with a new initial seed pixel. Therefore, different spatially isolated tissue region can thus be automatically segmented. For each spatially isolated tissue region, the recorded mode of region growing is used to select the correct phase vector with high confidence, thus ensuring different spatially isolated tissue regions are processed consistently. In so doing, embodiments of the present invention address a fundamental difficulty in phase correction that is needed in phase sensitive MRI.

U.S. Pat. No. 7,227,359 (the '359 patent) entitled "Method and apparatus for phase sensitive magnetic resonance imaging" discloses apparatus and methods for phase correction in magnetic resonance images. In the '359 patent, phase correction by region growing is started from a single initial seed pixel for an entire image and only a single phase vector is considered at each step of the region growing. Therefore, it may have difficulties and is subject to potential inconsistencies when isolated regions or high noise regions are present within a single image.

Embodiments of the disclosure may present an alternative post processing strategy that uses a generalized signal model and features a particular type of optimized region growing scheme (which can be fully automated) without a need for image thresholding. As demonstrated below, using such embodiments, one can realize more successful water and fat separation. For example, water and fat separation has been achieved with phantom and in vivo images by a 3D dual-echo acquisition with flexible echo times. The optimized region growing scheme of the present disclosure, which can handle input images with more flexible phases, can lead to a wide range of applications in phase-sensitive MRI, as will be recognized by those having ordinary skill in the art. As but one example: because of the increase in flexibility associated with input images having flexible echo times, a less efficient dual echo image acquisition with unipolar flyback readout gradients may be used as a practical alternative to a more efficient bipolar acquisition given its advantage of having no off-resonance related spatial misregistration between the two input images along a frequency-encode direction. As an another example, a triple-echo readout that maximizes the data acquisition efficiency in a fast spin echo pulse sequence, or in a spin echo pulse sequence, or in a balanced steady state free precession sequence, may be used to acquire three images in a single acquisition. In this case, the two images from the $1^{st}$ echo and the $2^{nd}$ echo may be processed to generate one set of water-only and fat-only images, and the two images from the $2^{nd}$ echo and the $3^{rd}$ echo may be processed to generate a second set of water-only and fat-only images. The two sets of water-only and fat-only images may be combined to yield a final set of water-only and fat-only images with improved signal-to-noise ratio. Alternatively, the processing of the images from the first echo and the second echo and the processing of the images from the second echo and the third echo may be jointly considered in a similarly designed region growing scheme to reduce processing time and further improved processing reliability.

In one respect, embodiments of the present disclosure involve methods for phase-sensitive MRI to separate an intrinsic signal phase from a coexistent background or error phase, which could be due to field inhomogeneity or other system imperfections. For many applications, such as Dixon chemical shift imaging and phase sensitive inversion recovery imaging, the background or error phase usually varies slowly in space from pixel to pixel. The intrinsic phase, on other hand, may be determined by tissue distribution and can have sudden spatial changes. The optimized region growing methods disclosed here are able to handle background or error phase correction in the presence of regions of low signal-to-noise ratio and/or of large image artifacts, and is in general applicable to applications such as Dixon water and fat imaging with flexible echo times or single-point Dixon silicone specific imaging.

In another respect, methods are provided that include steps for acquiring a plurality of MRI data signals and forming complex images from the data signals. In some embodiments, the data may be acquired from multiple slices, multiple receiver coils, or even at different time points as dynamic series. Further, a pulse sequence and a partially parallel imaging technique, such as a sensitivity encoding (SENSE) technique, may be performed to acquire the data in a shortened acquisition time. The data may be an opposed-phase echo and an in-phase echo of a first and second signal data, or it may have flexible phases that do not have in- and opposed-phases. In some embodiments, the echo may be acquired by performing a gradient-echo dual-echo sequence (e.g., a two-dimensional gradient-echo dual-echo sequence or a three-dimensional gradient-echo dual-echo sequence). In other embodiments, the echo may be acquired by performing a two-dimensional spin echo pulse sequence. Alternatively, the echo may be acquired by performing a fast spin echo sequence (e.g., a two-dimensional sequence or three-dimensional fast spin echo sequence), a spin echo sequence, or a balanced steady state free precession sequence (e.g., a two-dimensional or a three-dimensional sequence). In the fast spin echo, spin echo, or balanced steady state free precession sequences, it may be preferable to use a triple echo readout for maximal data acquisition efficiency. In some respects, data may be acquired from an inversion recovery pulse sequence. The data may be acquired from an inversion recovery fast spin echo sequence (e.g., two-dimensional sequence or three-dimensional fast spin echo sequence). Alternatively, the data may be acquired from an inversion recovery two-dimensional or three-dimensional gradient echo sequence.

In other respects, data may be acquired from a one-point Dixon echo, which includes water and fat signals or further includes silicone signals. In one embodiment, the one-point Dixon data may be acquired from a gradient-echo sequence with a flexible echo time (e.g., two-dimensional or three-dimensional gradient-echo sequence). In other embodiments, one-point Dixon data may be acquired by time-shifting conventional spin echo, such as in a two-dimensional spin echo sequence. Alternatively, the one point Dixon data may be acquired from a two-dimensional or three-dimensional fast spin echo sequence. Further, the one point Dixon data may be acquired with an echo shift in any of the pulse sequences so that water and fat signals are substantially in-phase and the silicone signal is substantially out-of-phase with the water and fat signals. Subsequent processing using the disclosed methods allow for the generation of silicone-only images and silicone-suppressed images.

Certain embodiments of the present disclosure involve a particular type of the optimized region growing process that may be followed with algebraic calculations, which can yield a fat-only image and a water-only image in the case of Dixon chemical shift imaging. Alternatively, phase sensitive inversion recovery image can be taken as the real part of a phase corrected inversion recovery image. These images may then be displayed or archived using output and storage devices. Other uses for phase correction processing include imaging of silicone, such as in breast imaging of silicone breast implants.

In other respects, systems or apparatuses are disclosed. Embodiments of a system may include a magnetic resonance imaging (MRI) scanner capable of running a pulse sequence such as a fast gradient-echo dual-echo sequence, a controller, and an output device. The MRI scanner may be adapted to provide a plurality of data signals following a scan. Using a pulse sequence such as the fast gradient-echo dual-echo pulse sequence, a plurality of data signals may be produced, collected, and sent to the controller for processing. The controller may receive the data signals and implement image reconstruction and a phase correction algorithm to produce an image or images (e.g., a water-only image, a fat-only image, etc.). The system may additionally include a processor and a memory comprising machine executable code configured to perform image processing steps.

In one respect, embodiments of this disclosure may involve a computerized method for generating a phase corrected magnetic resonance image or images. A magnetic resonance image or images containing error and intrinsic phase information is acquired. Two phase vector images A and B are calculated either explicitly or implicitly using the acquired image or images so that a vector orientation by one of the two vector images at a pixel is substantially determined by the background or error phase at the pixel, and the vector orientation at the pixel by the other vector image is substantially different from that determined by the background or error phase at the pixel. An optimized region growing phase correction algorithm is applied to the vector images A and B to construct two new updated vector images A and B, wherein the algorithm includes:

(i) selecting an initial seed pixel or pixels and assigning A and B of the initial seed pixel or pixels as the updated A and B for the initial seed pixel or pixels and place the initial seed pixel or pixels onto a series of ordered pixel stacks;

(ii) selecting a pixel from the pixel stack having the highest priority (see below) and containing at least one unprocessed pixel as a selected seed pixel. At the very beginning, the initial seed pixel will be selected as the selected seed pixel because it is the only pixel on the pixel stacks.

(iii) calculating the reference vector pair $A_r$ and $B_r$ for the selected pixel as the average of A and B of all the processed pixels that are within a certain boxcar centered at the secondary seed pixel. At the very beginning, $A_r$ and $B_r$ will be the same as A and B because no other pixels have been processed.

(iv) determining the updated A and B for the selected pixel as one of several possible vector pairs that has the best orientation match with the reference vector pair $A_r$ and $B_r$. For two point Dixon imaging with flexible echo times, three possible vector pairs can be determined from the input vector pair A and B of the selected seed pixel. Assuming that the relative angular relationship between A and B is consistent with that of the reference vector pair $A_r$ and $B_r$ (otherwise, A and B can simply be interchanged for them to be consistent), the three possible vector pairs are: (1) A and B, (2) B and Ã, (3) B̃ and A, where Ã and B̃ are illustrated in FIG. 3 and defined as the vectors of mirror reflection of A and B with respect to B and A, respectively. The best matching vector pair is selected as the one with the minimum of the following:

$$\epsilon_1 = |\text{angle}(AA_r^*)| + |\text{angle}(BB_r^*)| \qquad [B1]$$

$$\epsilon_2 = |\text{angle}(\tilde{B}A_r^*)| + |\text{angle}(AB_r^*)| \qquad [B2]$$

$$\epsilon_3 = |\text{angle}(BA_r^*)| + |\text{angle}(\tilde{A}B_r^*)| \qquad [B3]$$

For example, A and B are selected as the updated A and B for the selected seed pixel if $\epsilon_1$ is smaller than both $\epsilon_2$ and $\epsilon_3$. Conversely, B̃ and A are selected as the updated A and B for the selected seed pixel if $\epsilon_2$ is smaller than both $\epsilon_1$ and $\epsilon_3$;

(v) determining for the selected seed pixel a local quality metric for each of the nearest neighbor pixels of the selected seed pixel for which the updated A and B have not been determined and assigning a priority to each of the nearest neighbor pixels and placing them onto one of the pixel stacks using the local quality metric in order to determine the sequence by which each of the nearest neighbor pixels is to be selected as a further selected seed pixel. One quality metric that can be used is the smallest of three angular differences defined similarly as in Equations [B1-B3], except for between the reference $A_r$ and $B_r$ of the nearest neighbor pixel and the three possible vector pairs of the same nearest neighbor pixel;

(vi) recording and monitoring the quality metric of the processed pixel;

(vii) recording and monitoring the mode of region growing for the processed pixel. The mode is defined for identifying which vector pair is selected in Step iv): (1) A and B, (2) $\tilde{B}$ and A, (3) B and $\tilde{A}$.

(viii) repeating the steps of (ii) through (vii) to complete the region growing until the recorded and monitored quality metric detects completion of processing of a spatially isolated tissue region. When that happens, the recorded mode of region growing will be used to select the correct phase vector from the updated A and B for this thread of region growing. Separately, a new thread of region growing will be started with a new initial seed to process another spatially isolated tissue region (if present); an (ix) Constructing a final output vector image O from all processed tissue regions so that the orientation of the final output vector image O at each pixel is substantially determined by the background or error phase at the pixel.

The phase corrected magnetic resonance image or images may be generated from the acquired magnetic resonance image or images using the vector image O, and the phase corrected magnetic resonance image or images may be displayed or archived.

In other respects, embodiments may involve first correcting vector images A and B with a global linear error phase correction along one or more dimensions prior to performing the parallelizable and multileveled sequenced region growing. A low-pass filter may be applied to vector image O before generating the phase corrected magnetic resonance image or images. Amplitudes of the vector images A and B at a pixel may be weighted by a signal amplitude at the pixel. An initial seed pixel or pixels may be selected from a high-quality region, where high-quality includes a predetermined signal-to-noise ratio or a predetermined local orientational coherence for the vector images A or B. An initial seed pixel or pixels and the values of the updated A and B at the initial seed pixel or pixels may be selected based on an orientational coherence of either A or B at the initial seed pixel or pixels with O at a spatially or temporally neighboring pixel or pixels of a spatially or temporally neighboring image for which the updated A and B is already known or has been determined. An initial seed pixel or pixels may be placed onto a high priority pixel stack or stacks among a series of pixel stacks that are initially empty and which facilitate a sequencing of the sequenced region growing.

In other respects, embodiments may involve a local quality metric of a pixel being calculated as the smallest of three orientational differences as defined in Equations [B1-3] between A and B of the pixel (or B and $\tilde{A}$, or $\tilde{B}$ and A, where $\tilde{A}$ and $\tilde{B}$ are as illustrated in FIG. 3 and defined as the vectors of mirror reflection of A and B with respect to B and A, respectively) with an estimated reference $A_r$ and $B_r$ for the same pixel. The estimated reference $A_r$ and $B_r$ for the pixel may be a zeroth order estimation calculated as an average of the updated A and B for pixels located within a neighboring region of the pixel and for which the updated A and B has been previously determined. The estimated updated A and B for the pixel may be a first order estimation that includes an average and a linear expansion of the updated A and B for pixels that are located within a neighboring region of the pixel and for which the updated A and B has been previously determined. A size of the neighboring region may be either fixed or adaptively adjusted based on a local quality metric for the pixel. The maximum possible range of 0-π for the angular difference between any two vectors may be used to gauge and bin the local quality metric and to place a pixel onto a pixel stack. The pixel stack covering a subrange of 0-π for the quality metric may be assigned a priority, where a pixel stack of a higher priority is for receiving pixels with a smaller quality metric, and a pixel stack of a lower priority is for receiving pixels with a larger quality metric. The priority of a pixel stack from which a pixel is selected as a secondary seed pixel may be recorded for the sequenced region growing as a quality metric index to reflect an integrity of the sequenced region growing. The quality metric index may be used to automatically segment an image into different segments of possible inconsistent region growing and then to combine the different segments into an overall consistent region growing to form a final set of the updated vector images A and B.

In other respects, embodiments may involve the optimized region growing being performed in two spatial dimensions. The optimized region growing may be performed in three spatial dimensions. The optimized region growing may be performed by including the temporal dimension for a series of dynamically acquired images.

In other respects, embodiments may involve acquiring two-point Dixon water and fat images, wherein a first image S1 is acquired at a first echo time TE1 and a second image S2 is acquired at a second echo time TE2. Acquiring two-point Dixon water and fat images may involve using dual-echo bipolar readout gradients. Acquiring two-point Dixon water and fat images may involve using dual-echo unipolar readout gradients. Acquiring two-point Dixon water and fat images may involve using triple-echo readout gradients. Acquiring two-point Dixon water and fat images may involve using interleaved single echo readout gradients.

In other respects, embodiments may involve selection of TE1 and TE2 being flexible except to avoid a small orientational difference between vector image A and vector image B. The images $S_1$ and $S_2$ may be expressed according to the following equations:

$$S_1 = (W + \delta_1 F e^{i\theta_1}) P_1$$

$$S_2 = (W + \delta_2 F e^{i\theta_2}) P_1 P$$

where W and F are amplitudes for water and fat respectively, $P_1$ is a phase factor of image $S_1$, P is an additional phase factor of image $S_2$ relative to image $S_1$ and is determined by a background or error phase, and one may determine by an image based pre-calibration an amplitude attenuation factor $(\delta_1, \delta_2)$ and phase $(\theta_1, \theta_2)$ as a function of two echo times (TE1, TE2) for the fat signal. Pre-calibration of $(\delta_1, \delta_2)$ may be performed in part by determining an echo time dependence of a signal amplitude of a known fat-only image region, and pre-calibration of $(\theta_1, \theta_2)$ may be performed in part by determining an echo time dependence of a phase discontinuity between a known fat-only image region and a neighboring known water-only region. The pre-calibration may be performed for a given pulse sequence, a scan protocol, or a magnetic field strength.

In other respects, embodiments may involve the images $S_1$ and $S_2$ being used to generate two vector images A and B as expressed according to the following equations:

$$A=S^*_1 S_2[Q_A+\delta_1(1-Q_A)e^{i\theta_1}]/[Q_A+\delta_2(1-Q_A)e^{-i\theta_2}]$$

$$B=S^*_1 S_2[Q_B+\delta_1(1-Q_B)e^{i\theta_1}]/[Q_B+\delta_2(1-Q_B)e^{-i\theta_2}]$$

where $Q_A$ and $Q_B$ are the two mathematically possible solutions of the following quadratic equation of Q, which is defined as $$Q = \frac{W}{W+F}$$

(i.e., the water fraction for a given pixel):

$$[(1+\delta_2^2-2\delta_2 \cos\theta_2)M_1-(1+\delta_1^2-2\delta_1 \cos\theta_1)M_2]Q^2-2[\delta_2 \cos\theta_2)M_1-(\delta_1^2-\delta_1 \cos\theta_1)M_2]Q+[(M_1\delta_2^2-M_2\delta_1^2)]=0$$

where $M_1$ and $M_2$ are the square of the amplitudes of the images $S_1$ and $S_2$, respectively (i.e., $M_1=|S_1|^2$ and $M_2=|S_2|^2$). The vector images may be further normalized and weighted by a signal amplitude, such as:

$$A' = \frac{A}{|A|}\sqrt{M_1+M_2}$$

$$B' = \frac{B}{|B|}\sqrt{M_1+M_2}$$

where again, $M_1=|S_1|^2$ and $M_2=|S_2|^2$.

In another embodiment, the two vector images can simply be constructed from the two input images as:

$$A=S_2 S_1^*$$

$$B=Ae^{i(\theta_2-\theta_1)}$$

In either case, the optimized region growing may be used to construct two updated vector images A and B from the two input vector images A and B. A vector image O may be selected from the two vector images of the updated A and B and used to phase correct and remove the phase factor P from the image $S_2$, the phase corrected $S_2$ may be combined with $S_1$ to solve for $WP_1$ and $FP_1$, and then to generate a water-only image and a fat-only image according to the following equations:

$$W=\text{Real}\{(WP_1)\overline{WP_1}^*/|\overline{WP_1}|\}$$

$$F=\text{Real}\{(FP_1)\overline{FP_1}^*/|\overline{FP_1}|\}$$

where Real { ... } is to take the real component of its complex argument, * is to take the complex conjugate of its argument, and $\overline{WP_1}$ and $\overline{FP_1}$ represent low-pass filtering of $WP_1$ and $FP_1$, respectively.

In other respects, embodiments may involve acquiring a single-point Dixon water and fat image wherein a flexible echo time TE is used and the acquired magnetic resonance image is expressed as: $S=(W+Fe^{i\theta})P$, where $\theta$ is dependent on TE and the dependence is determined with an image-based pre-calibration, and $P(\equiv e^{i\Phi})$ is a phase factor for the image S. The vector image A may be set to S and the vector image B may be set to $Se^{-i\theta}$. An optimized region growing may be used to construct two updated vector images A and B from the two input vector images A and B, the vector image O (selected as one of the two updated vector images A and B) may be used to phase correct or remove P from S to form S', and a water-only image and a fat-only image may be generated according to:

$$F=\text{Imag}\{S'\}/\sin\theta$$

$$W=\text{Real}\{S'-F\cos\theta\}$$

where Real{ ... } and Imag{ ... } are to take the real and imaginary components of their component, respectively.

In other respects, embodiments may involve acquiring a single-point silicone specific image at an echo time TE when water and fat signals are substantially in-phase, and the acquired magnetic resonance image may be expressed according to the following equation:

$$S=(W+F+Ie^{i\theta})P$$

where $\theta$ is determined with an image-based pre-calibration for the echo time TE as a phase discontinuity of a known silicone-only image region and a neighboring known water or fat only image region, and $P(\equiv e^{i\Phi})$ is a phase factor for the image S. Vector image A may be set to S and vector image B may be set to $Se^{-i\theta}$. An optimized region growing may be used to construct two updated vector images A and B from the two input vector images A and B, the vector image O (selected from either U or V) may be used to phase correct or remove P from S to form S', and a silicone-only image and a silicone-suppressed image may be generated according to:

$$I=\text{Imag}\{S'\}/\sin\theta$$

$$W+F=\text{Real}\{S'-I\cos\theta\}$$

where Real{ ... } and Imag{ ... } are to take the real and imaginary components of their component, respectively.

In other respects, embodiments may involve acquiring an inversion recovery image at an inversion recovery time TI and the image may be expressed according to the following equation:

$$S=Ie^{i\theta}$$

where I is a signal magnitude and $\theta$ is a measured signal phase that comprises a background or error phase and an intrinsic signal phase. Vector image A may be set to S and vector image B may be set to −S. An optimized region growing may be used to construct two updated vector images A and B from the two input vector images A and B, the vector image O may be used to phase correct the image S, and the phase corrected image S may be displayed and archived as a phase sensitive inversion recovery image.

In other respects, embodiments may involve any apparatuses or systems configured to perform one or more steps disclosed herein in any combination, using for example one or more processors and memory devices coupled to imaging equipment. In still other respects, embodiments may involve software configured to perform one or more steps disclosed herein in any combination.

Other features and associated advantages will become apparent with reference to the following detailed description of specific, example embodiments in connection with the accompanying drawings.

BRIEF DESCRIPTION OF THE DRAWINGS

The following drawings form part of the present specification and are included to further demonstrate certain aspects of disclosed embodiments. The drawings do not limit the invention but simply offer examples.

FIG. 6C FIGS. 6E-6F illustrate the recorded sequence of the priority order of pixels from FIGS. 6C-6D as they were being processed for region growing.

DESCRIPTION OF ILLUSTRATIVE EMBODIMENTS

Figure 1:
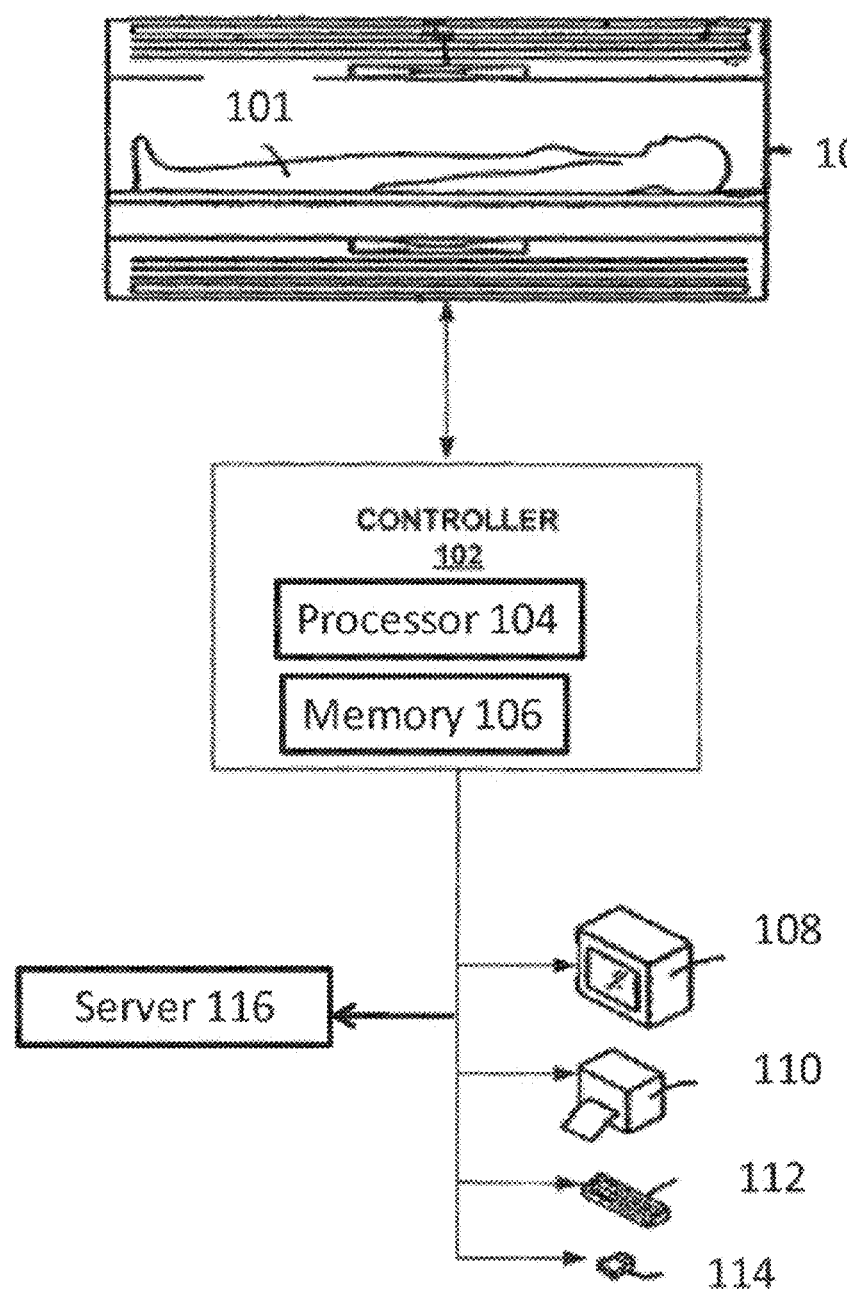
FIG. 1 is an illustration of an MRI apparatus and system in accordance with embodiments of this disclosure.

Embodiments of the present invention include methods, systems, apparatuses, and non-transitory computer readable media that can make use of efficient and robust phase correction algorithms, which can be applied to applications such as, but not limited to, all types of phase sensitive MRI. One application used for illustration here is a 2PD (2-point Dixon) technique with a fast gradient-echo dual-echo data acquisition pulse sequence and a phase-correction algorithm to produce higher resolution images taken from an MRI scan. In other embodiments, a phase correction algorithm according to embodiments of this disclosure may be used in applications such as, but not limited to, one-point Dixon (1PD) techniques for water and fat imaging, one-point Dixon (1PD) techniques for silicone-specific imaging, and phase sensitive inversion recovery imaging. For Dixon chemical shift imaging, a phase correction algorithm according to embodiments of this disclosure may be applied to data collected with different types of pulse sequences, such as conventional spin echo pulse sequences and fast spin echo pulse sequences. The data collected may be from a two-dimensional acquisition or from a three-dimensional acquisition. The data collected may also be from time-series studies such as when used to study contrast agent uptake behavior after a contrast agent is injected into a patient. Alternatively, the data may be acquired with partially parallel imaging techniques such as the sensitivity encoding (SENSE) technique. In these embodiments, after the reconstruction of the acquired images, techniques are provided for correcting background or error phase that may arise as a result of field inhomogeneity or other system imperfections.

In one respect, phase-correction algorithms according to embodiments of this disclosure involve a particular type of optimized region growing process. The sequence of the region growing may be determined using a quality metric of seed pixels, and selection of the seed pixels may be automatically sorted-out using a series of pixel stacks that bin and hold the seed pixels. The direction for the phase vectors of each of the pixels may be determined from an estimated direction using both the amplitude and the phase of the phase vectors of those pixels already determined and that are located within a neighboring area, such as an area defined by a boxcar in two-dimensions or by a regular cuboid in three-dimensions, typically centered around a pixel under consideration. Other shapes and various sizes—fixed and adaptively adjusted—can reflect a suitable neighboring area.

Exemplary embodiments of the present disclosure further include a novel optimized region growing algorithm as explained in further detail below. Exemplary embodiments of the present disclosure can include, for example, using a quality guidance and multiple ordered pixel stacks to automatically determine the sequence of region growing. In addition, both correct and incorrect phase vectors are jointly considered at each step of region growing for improved processing reliability. Furthermore, both the quality and mode of region growing for each pixel are recorded and monitored so that spatially isolated tissue regions can be automatically segmented and processed with different threads of region growing. The correct vector of each thread of region growing is independently selected based on the recorded region growing mode so that the region growing results for the different spatially isolated tissue regions are consistent.

In FIG. 1, an MRI apparatus, in accordance with an embodiment of the present disclosure, is presented. The MRI apparatus includes a scanner 100, a controller 102, a processor 104, a memory 106, output devices such as a display screen 108, an output printing device 110, and input devices such as a keyboard 112 and a mouse 114. A server 116 may also be included that may communicate with controller 102 and input and output devices such as keyboard 112 and mouse 114. The server 116 and the controller 102 may comprise one or more processors such as processor 104 coupled to, and in communication with, one or more memories such as memory 106. The server 116 may be coupled to the controller 102, and such coupling may be through intermediate devices or a network connection, such as the Internet, or otherwise.

In certain embodiments of this disclosure, error phase correction may be implemented through the use of, for example, processor 104 and memory 106 in the controller 102 or associated with the server 116.

Techniques of the present disclosure may be applied to certain existing MRI hardware commercially available by those known in the art through appropriate programming or data processing techniques, as will be understood to those having ordinary skill in the art, and further as described herein.

In one embodiment, a patient 101 may be placed inside scanner 100. The controller 102 may control aspects of imaging and obtain data, process the data to obtain desired image(s), and output final image(s) to an output device of choice, such as a display screen 108, printing device 110, an electronic storage (local or distant via, for example, a network connection). Images may also be transmitted through a network connection to server 116. Other transmission techniques known in the art may also be utilized.

Two-point Dixon Water and Fat Imaging

Representing one group of embodiments, the following discloses a signal model and mathematics suitable for two-point Dixon water and fat imaging techniques using flexible echo times, among other applications as will be apparent to those having ordinary skill in the art.

Two raw images acquired at echo times TE1 and TE2 may be expressed as:

$$S_1=(W+\delta_1 F e^{i\theta_1})P_1 \quad [1]$$

$$S_2=(W+\delta_2 F e^{i\theta_2})P_1 P \quad [2]$$

in which W and F represent the amplitudes of water and fat, respectively. $(\delta_1, \delta_2)$ and $(\theta_1, \theta_2)$ are the amplitude attenuation factors and chemical shift-related phases of fat at TE1 and TE2, respectively. $P_1$ is the phasor (defined as a complex number with a unit amplitude) of the image $S_1$ and includes the effects of all of its phase factors (e.g., magnetic field inhomogeneity) except that of the chemical shift of fat. P is an additional phasor of $S_2$ relative to $S_1$. For given TE1/TE2, $(\delta_1, \delta_2)$ and $(\theta_1, \theta_2)$ can be considered known parameters via an image-based precalibration without assuming any specific spectral model or resorting to measurements by magnetic resonance spectroscopy (described below).

The following can be calculated using Eqs. [1-2]:

$$M_1=(W^2+\delta_1^2 F^2+2\delta_1 WF \cos \theta_1) \quad [3]$$

$$M_2=(W^2+\delta_2^2 F^2+2\delta_2 WF \cos \theta_2) \quad [4]$$

in which $M_1=|S_1|^2$ and $M_2=|S_2|^2$.

Analogous to Berglund et. al., (Magnetic Resonance in Medicine 65:994-1004 (2011)), one may define:

$$Q = \frac{W}{W+F} \quad [5]$$

which represents the water fraction for a given image pixel.

Eqs. [3 and 4] can be rewritten as:

$$\frac{M_1 M_2}{(W+F)^2} = \left[\left(\frac{W}{W+F}\right)^2 + \delta_1^2\left(\frac{F}{W+F}\right)^2 + 2\delta_1\cos\theta_1\frac{WF}{(W+F)^2}\right]M_2 \quad [6]$$

$$\frac{M_1 M_2}{(W+F)^2} = \left[\left(\frac{W}{W+F}\right)^2 + \delta_2^2\left(\frac{F}{W+F}\right)^2 + 2\delta_2\cos\theta_2\frac{WF}{(W+F)^2}\right]M_1 \quad [7]$$

Combining Eqs. [6 and 7] and recognizing that $$1-Q = \frac{F}{W+F},$$

one gets:

$$[(1+\delta_2^2-2\delta_2 \cos \theta_2)M_1-(1+\delta_1^2-\delta_1 \cos \theta_1)M_2]Q^2 - 2[(\delta_2^2-\delta_2 \cos \theta_2)M_1-(\delta_1^2-\delta_1 \cos \theta_1)M_2]Q + [(M_1\delta_2^2-M_2\delta_1^2)]=0 \quad [8]$$

This is a quadratic equation for Q. One may define:

$$a'_1=[(1+\delta_2^2-2\delta_2 \cos \theta_2)M_1-(1+\delta_1^2 2\delta_1 \cos \theta_1)M_2] \quad [9]$$

$$a'_2=-2[(\delta_2^2-\delta_2 \cos \theta_2)M_1-(\delta_1^2-\delta_1 \cos \theta_1)M_2] \quad [10]$$

$$a'_3=[(M_1\delta_2^2-M_2\delta_1^2)] \quad [11]$$

Eq. [8] can be rewritten as:

$$a'_1 Q^2+a'_2 Q+a'_3=0 \quad [12]$$

which has the following two mathematically possible solutions:

$$Q_{A,B} = \frac{-a'_2 \pm \sqrt{a'^2_2 - 4a'_1 a'_3}}{2a'_1} = \frac{a_2 \pm \sqrt{a_3}}{a_1} \quad [13]$$

in which:

$$a_1 = a'_1 = [(1+\delta_2^2 - 2\delta_2\cos\theta_2)M_1 - (1+\delta_1^2 - 2\delta_1\cos\theta_1)M_2] \quad [14]$$

$$a_2 = -\frac{a'_2}{2} = [(\delta_2^2 - \delta_2\cos\theta_2)M_1 - (\delta_1^2 - \delta_1\cos\theta_1)M_2] \quad [15]$$

$$a_3 = \frac{a'^2_2 - 4a'_1 a'_3}{4} = [(\delta_1^2 + \delta_2^2 - 2\delta_1\delta_2\cos\theta_1\cos\theta_2)M_1 M_2 - \delta_2^2\sin^2\theta_2 M_1^2 - \delta_1^2\sin^2\theta_1 M_2^2] \quad [16]$$

In general, only one of the two solutions in Eq. [13] corresponds to the true and physical solution for the water fraction Q.

Determining the true and physical solution for the water fraction Q for all the pixels of an image is in general a very challenging problem. Here, a particular type of novel optimized region growing based phase correction may be used to obtain solutions. At this point, selecting the true and physical solution for Q from the two sets of choices in Eq. [13] requires consideration of the phase of the acquired signals (which is removed in Eqs. [3] and [4] by the absolute value operation).

For this purpose, Eqs. [1-2] can be combined to yield the following:

$$S^*_1 S_2=(W+\delta_1 F e^{-i\theta_1})(W+\delta_2 F e^{j\theta_2})P \quad [17]$$

Dividing Eq. [17] by $(W+F)^2$, one gets:

$$\frac{S^*_1 S_2}{(W+F)^2} = [Q+\delta_1(1-Q)e^{-i\theta_1}][Q+\delta_2(1-Q)e^{i\theta_2}]P \quad [18]$$

Using the two solutions from Eq. [13], the following two vectors can be formed:

$$A=S^*_1 S_2/[Q_A+\delta_1(1-Q_A)e^{i\theta_1}]/[Q_A+\delta_2(1-Q_A)e^{-\theta_2}] \quad [19]$$

$$B=S^*_1 S_2/[Q_B+\delta_1(1-Q_B)e^{i\theta_1}]/[Q_B+\delta_2(1-Q_B)e^{-\theta_2}] \quad [19]$$

The amplitudes of A and B are to the $2^{nd}$ power order of W and F. For the following processing, they can be weighted differently, e.g., to be approximately linearly proportional to W and F to form a new set of A and B:

$$A' = \frac{A}{|A|}\sqrt{M_1 + M_2} \quad [21]$$

$$B' = \frac{B}{|B|}\sqrt{M_1 + M_2} \quad [22]$$

Other forms of weighting can also be used if desired, as will be recognized by those having ordinary skill in the art. Here, note that independent of the actual value of Q for a given pixel, the direction represented by either A' or B' will be substantially equal to that represented by P if the correct, true physical solution for Q is represented by $Q_A$ or $Q_B$ in Eqs. [19-20].

Because P is determined by underlying factors (e.g., magnetic field inhomogeneity) that are spatially smooth, we can expect that the direction of either A' or B' to be also smooth when the correct, true physical solution of Q is selected. This expectation holds independent of what is the actual value of Q.

It can further be noted that for all the water-only pixels (i.e., pixels where Q=1), the direction of either A' or B' will be substantially equal to that represented by $Pe^{i(\theta_1-\theta_2)}$ when the incorrect, unphysical solution of Q is selected. For all the fat-only pixels (i.e., pixels where Q=0), the direction of either A' or B' will be substantially equal to that represented by $Pe^{i(\theta_1-\theta_2)}$ when the incorrect, unphysical solution of Q is selected. For the pixels with a mixture of water and fat (i.e., pixels where 0<Q<1), the direction of either A' or B' will deviate from that of the water-only or fat-only pixel by a Q-dependent amount when the incorrect, unphysical solution of Q is selected. Since the majority of the pixels are known to be either water-dominant or fat-dominant in a medical image, the direction of either A' or B' when the incorrect, unphysical solution of Q is selected is expected to be spatially smooth, except between neighboring pixels that are dominated with different chemical species of water or fat. Even for pixels with a mixture of water and fat, the direction of either A' or B' when the incorrect, unphysical solution of Q is selected is expected to remain spatially smooth, as long as the actual water and fat content does not change suddenly.

Based on the above analysis, another formation of the two vectors that can be used as an alternative to Eqs. [19-20] are:

$$A = S_2 S_1^* \quad [23]$$

$$B = A e^{i(\theta_1-\theta_2)} \quad [24]$$

Figure 3:
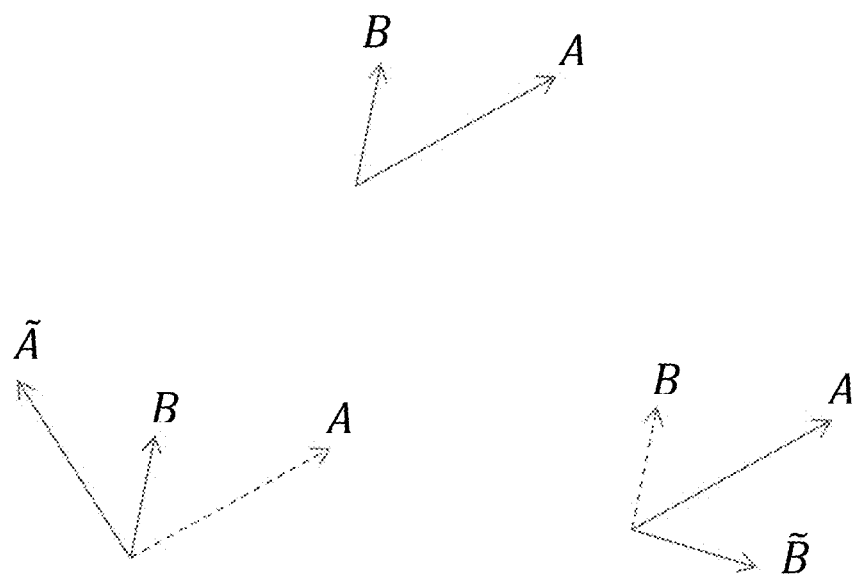
FIG. 3 is an illustration of vector pairs in accordance with embodiments of this disclosure.

Also based on the above analysis, we expect that in either case if the two vector solutions of a neighboring pixel or of a reference are $A_r$ and $B_r$, and given that the two possible vector solutions of the pixel under consideration are A and B, we can form three new possible vector pairs (1) A and B, (2) B and Ã, (3) B̃ and A, where Ã and B̃ are illustrated in FIG. 3 and defined as the vectors of mirror reflection of A and B with respect to B and A, respectively. The best possible vector pair for the pixel under consideration will be the one with the minimum of the following angular differences:

$$\epsilon_1 = |\text{angle}(AA_r^*)| + |\text{angle}(BB_r^*)| \quad [B1]$$

$$\epsilon_2 = |\text{angle}(\tilde{B}A_r^*)| + |\text{angle}(AB_r^*)| \quad [B2]$$

$$\epsilon_3 = |\text{angle}(BA_r^*)| + |\text{angle}(\tilde{A}B_r^*)| \quad [B3]$$

For example, A and B are selected as the updated A and B for the selected seed pixel if $\epsilon_1$ is smaller than both $\epsilon_2$ and $\epsilon_3$. Conversely, B̃ and A are selected as the updated A and B for the selected seed pixel if $\epsilon_2$ is smaller than both $\epsilon_1$ and $\epsilon_3$.

The vector that corresponds to the correct, true physical solution of Q of a given pixel is not expected to have a tilde operation (i.e., the two vectors should be either A or B, and not Ã or B̃). Therefore, after the updated A and B are selected for all the pixels, we can select one of them as the correct vector map O and use it to remove P from Eq. [2]. The corrected Eq. [2] can then be combined with Eq. [1] to easily (because the equations are linearized) solve for $WP_1$ and $FP_1$. Because $P_1$ is also expected to be spatially smooth in its angular orientation, $WP_1$ and $FP_1$ can be low-pass filtered to obtain $\overline{WP_1}$ and $\overline{FP_1}$ and then the SNR-optimized W and F:

$$W = \text{Real}\{(WP_1)\overline{WP_1}^*/|\overline{WP_1}|\} \quad [25]$$

$$F = \text{Real}\{(FP_1)\overline{FP_1}^*/|\overline{FP_1}|\} \quad [26]$$

Therefore, the basic formulation of the problem for two point Dixon imaging with flexible echo times can be summarized as follows: given two vector maps A and B, determine an output vector map O that is spatially smooth in orientation and represented for each pixel by either A or B.

When one of the two images is acquired when water and fat are completely in phase (e.g., in a spin echo or fast spin echo acquisition), the solution can be somewhat simplified. Assuming the in-phase image is $S_1$, then $\theta_1=0$. For simplicity, further assuming that $\delta_1=1$, $\delta=\delta_2/\delta_1$ and $\theta=\theta_2$, then Equations [1-2] can be expressed as:

$$S_1 = (W+F)P_1 \quad [S1]$$

$$S_2 = (W+\delta F e^{i\theta})P_1 P \quad [S2]$$

Let $I_1 = |S_1|$ and $I_2 = |S_2|$, then we have:

$$I_1 = W+F \quad [S3]$$

$$I_2^2 = W^2 + \delta^2 F^2 + 2\delta WF \cos\theta \quad [S4]$$

These two equations can be solved to yield the following two sets of solutions:

$$F_{1,2} = \frac{(1-\delta\cos\theta)I_1 \pm \sqrt{(1+\delta^2-2\delta\cos\theta)I_2^2 - \delta^2\sin^2\sin^2\theta I_1^2}}{1+\delta^2-2\delta\cos\theta} \quad [S5]$$

$$W_{1,2} = I_1 - F_{1,2} \quad [S6]$$

To form the two candidate vector solutions:

$$A' = S^*_1 S_2 (W_1 + \delta F_1 e^{-i\theta}) \quad [S7]$$

$$B' = S^*_1 S_2 (W_2 + \delta F_2 e^{-i\theta}) \quad [S8]$$

As in Equations [21-22], these two vector solutions can be normalized and re-weighted as:

$$A = \frac{A'}{|A'|}(I_1 + I_2); \quad [S9]$$

$$B = \frac{B'}{|B'|}(I_1 + I_2) \quad [S10]$$

The correct solution, and the task of phase correction, is again to determine an output vector map O that is spatially smooth in orientation and is represented for each pixel by either A or B.

Figure 2:
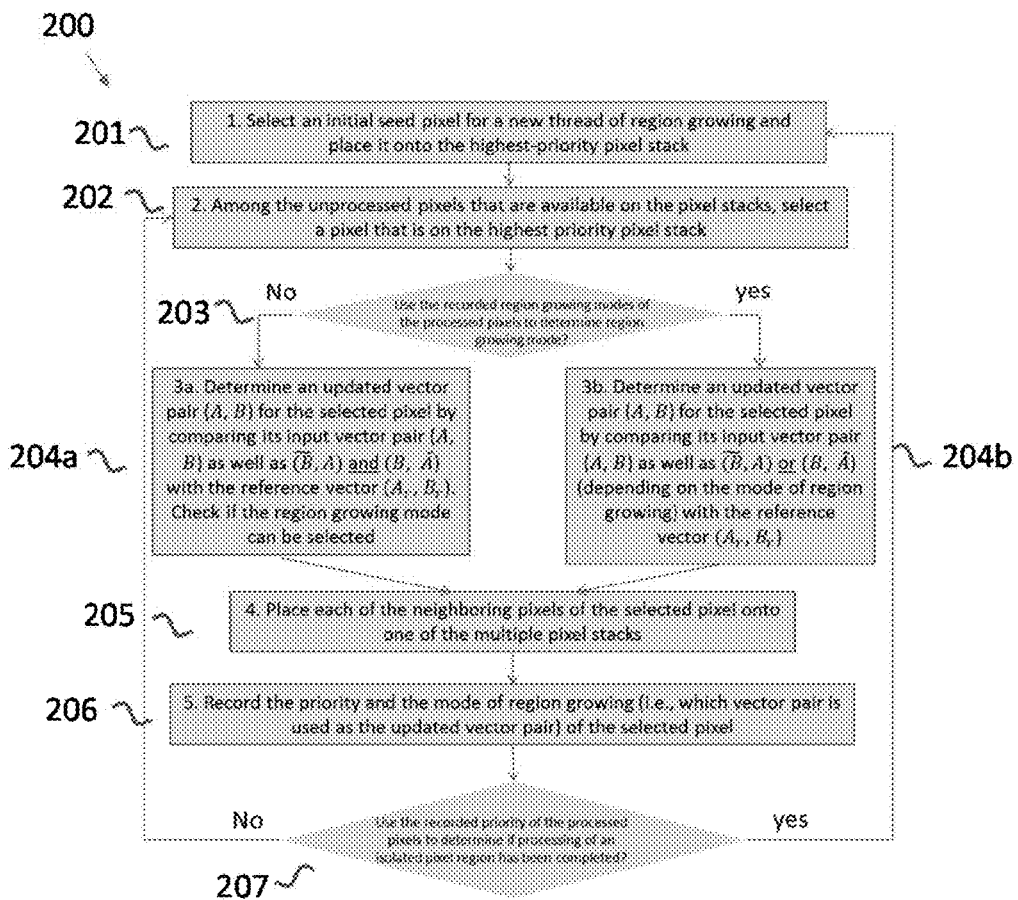
FIG. 2 is a flow chart illustrating steps in a method for phase correction in accordance with embodiments of this disclosure.

Referring now to FIG. 2, exemplary embodiments can comprise a method 200 that comprises steps 201-207 as indicated. Steps 201-207 may be used to generate a phase corrected magnetic resonance image and may follow any one or more of the calculations noted within this disclosure. These steps—or any steps disclosed here—may be performed on a suitable processor such as processor 104 of FIG. 1. The processor, in turn, may be coupled to, or associated with memory 106, controller 102, or server 116.

Prior to applying the disclosed optimized phase correction algorithm, an exemplary embodiment for two point Dixon imaging with flexible echo times includes acquiring images S1 at TE1 and S2 at TE2, and calculating vector maps A and B as previously described. The two vector images A and B are calculated using the acquired image or images so that a vector orientation by one of the two vector images at a pixel is substantially determined by the background or error phase at the pixel, and the vector orientation at the pixel by the other vector image is substantially different from that determined by the background or error phase at the pixel. In certain embodiments, method 200 may comprise an algorithm that may perform one or more of the following steps as outlined in further detail below. It is understood that the following listing of steps is merely exemplary and that certain embodiments may include fewer or additional steps than those listed here. In addition, certain embodiments may not perform the steps in the order presented in this disclosure.

As shown in FIG. 2, in step 201, an initial seed pixel is selected and placed onto the first of a series of pixel stacks arranged in a decreasing order of priority. All the pixel stacks are initially empty but become populated as region growing progresses (see below). Many pixels can qualify as the initial seed pixel. In the proposed implementation, the pixel that has the smallest phase gradient in A or B and that is not located near the edges of an image is selected as the initial seed pixel.

As shown in FIG. 2, in step 202, a pixel is selected for processing from the pixel stack that has the highest priority and that contains at least one unprocessed pixel.

In FIG. 2, step 204a or step 204b, the vector pair A and B is updated for the selected pixel. If the pixel is the initial seed pixel, the updated vector pair is simply the input vectors A and B of the pixel. For other pixels, we first compose a reference vector pair $A_r$ and $B_r$ as the sum of the updated A and B vectors of pixels that have been processed for region growing and that lie within the neighborhood of the pixel being processed. Depending on whether we have decided on the mode of region growing (see below), we will construct two or only one of the two additional vectors $\tilde{A}$ and $\tilde{B}$ as the mirror reflection of A and B, relative to B and A, respectively (FIG. 3). If we have not decided on the correct vector for the previously processed pixels, we will follow step 204a in FIG. 2 and calculate the following three angular differences:

$$\epsilon_1 = \angle (AA_r^*) + |(BB_r^*)| \quad [25]$$

$$\epsilon_2 = \angle (\tilde{B}A_r^*) + |(AB_r^*)| \quad [26]$$

$$\epsilon_3 = \angle (BA_r^*) + |(\tilde{A}B_r^*)| \quad [27]$$

One of the three vector pairs (i.e., A and B, $\tilde{B}$ and A, B and $\tilde{A}$) will be selected as the updated vector pair A and B for the pixel being processed if the corresponding angular difference (i.e., $\epsilon_1$, $\epsilon_2$, or $\epsilon_3$) is the minimum of the three angular differences.

For example, A and B are selected as the updated A and B for the selected pixel if $\epsilon_1$ is smaller than both $\epsilon_2$ and $\epsilon_3$. Conversely, B and $\tilde{A}$) are selected as the updated A and B for the selected pixel if $\epsilon_2$ is smaller than both $\epsilon_1$ and $\epsilon_3$;

If we have already decided which is the correct vector (e.g., A or B) for the previously processed pixels, we will follow step 204b) in FIG. 2 and calculate and compare only $\epsilon_1$ and one of the other two angular differences (i.e., $\epsilon_2$ or $\epsilon_3$) to decide if the updated vector pair for the pixel should be A and B or one of the other two vector pairs (i.e., $\tilde{B}$ and A, or B and $\tilde{A}$).

As shown in FIG. 2, in step 205, each of the nearest neighbor pixels of the just processed pixel is placed onto a pixel stack. For this purpose, the reference vector pair is first updated by including the vector pair of the processed pixel in the summation for calculating the reference. The angular differences between the vector pairs of the nearest neighbor pixel and the reference vector pair is then calculated according to Eqs. [25-27]. The minimum angular difference will be used to decide which pixel stack the nearest neighbor pixel is placed onto. Higher-quality pixels are expected to have smaller minimum angular differences and are placed onto the pixel stacks with higher priority. Conversely, lower-quality pixels are expected to have larger minimum angular differences and are placed onto the pixel stacks with lower priority.

As shown in FIG. 2, in step 206, both the priority order of the pixel stack from which the pixel is selected and the selection of the vector pair as its updated A and B for the pixel are recorded and monitored.

As shown in FIG. 2, in step 107, the recorded sequence of the priority order of the pixels is used to detect when region growing is processing a high-quality and reliable tissue region and when it is crossing a large spatial gap of low SNR or background. When such a gap is detected, region growing is looped back to the processing step 201 with a new initial seed pixel to start a new thread of region growing. When region growing is still within a high-quality tissue region, region growing is looped back to step 202 to select a new pixel to continue region growing.

As shown in FIG. 2, in step 203, while region growing is within a high-quality tissue region, the recorded vector pair configurations are used to determine the region growing mode used in step 204a or step 204b and to determine whether vector A or B is the correct vector for this thread of region growing. When the number of pixels being updated with the vector pair ($\tilde{B}$, A) becomes substantially greater than the number of pixels being updated with (B, $\tilde{A}$), the vector B of the initial seed pixel (and the updated vector B of all the pixels processed within the current thread of region growing) should be the correct vector, and we no longer need to consider (B, $\tilde{A}$) in step 204b. Conversely, when the number of pixels being updated with the vector pair (B, $\tilde{A}$) becomes substantially greater than the number of pixels being updated with ($\tilde{B}$, A), the vector A of the initial seed pixel (and the updated vector A of all the pixels processed within the current thread of region growing) should be the correct vector, and we no longer need to consider ($\tilde{B}$, A) in step 204b.

The above steps (steps 201-207) are repeated until all the pixels with an image are processed. At the completion of the region growing, each pixel will have its correct vector selected. The correct vector map after the region growing is designated as O.

To remedy certain isolated errors in region growing, a final pixel level optimization may be performed by comparing the angular difference between the locally average O of a pixel (over a selected boxcar) and its original input A and B. If A has a smaller angular difference than B with the locally average O for the pixel, A will be chosen as O for the pixel. Otherwise, B will be chosen as O for the pixel.

Pre-Calibration of the Dependence of ($\delta_1$, $\delta_2$) and ($\theta_1$, $\theta_2$) on $TE_1$ and $TE_2$:

The dependence of ($\delta_1$, $\delta_2$) and ($\theta_1$, $\theta_2$) on $TE_1$ and $TE_2$ used in Equations [1-2] can be affected by many factors such as the spectral complexity of fat and pulse sequence related scan parameters such as repetition time (TR) and flip angle. The following pre-calibration procedure can be used to account for all these variations and determine the dependence. In this procedure, we determine $(\theta_1, \theta_2)$ as a function of TE by measuring the phase discontinuity between a water-dominant region (e.g., muscle) and an abutting fat-dominant region (e.g., subcutaneous fat). Separately, we determine $(\delta_1, \delta_2)$ as a function of TE by measuring the image intensity variation of a fixed fat-dominant region (e.g., subcutaneous fat). Because fat in different subjects or anatomical locations is known to have very similar compositions, only one in vivo calibration is required to account for the effects of complex fat spectra. Different calibrations can be performed to account for other contributing factors (e.g., vastly different scan protocols or field strengths).

Figure 4A:
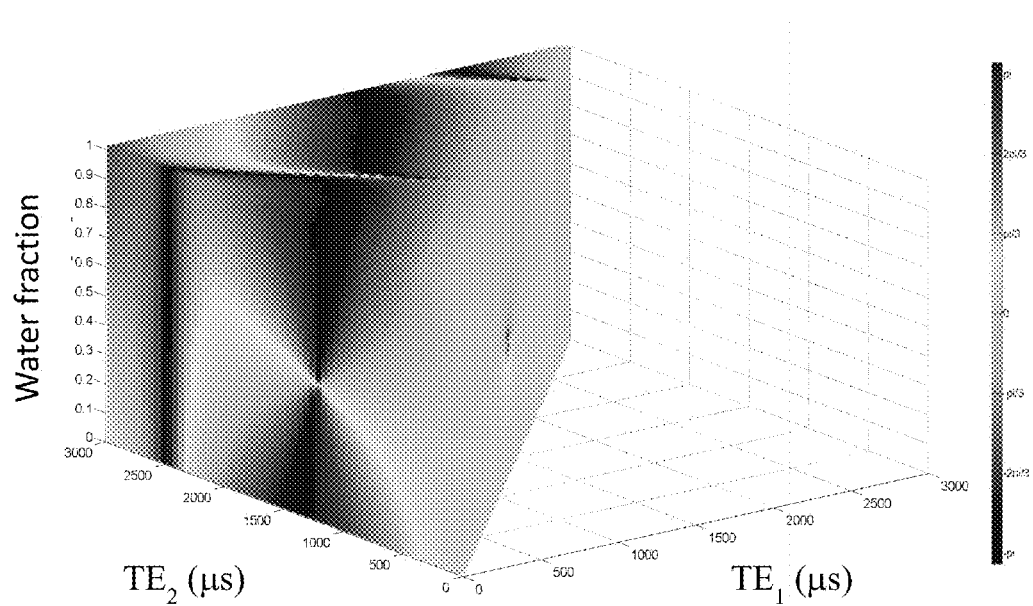
FIG. 4A is a three-dimensional graph that displays the relative angle of the incorrect input vector with respect to the correct input vector.
Figure 4B:
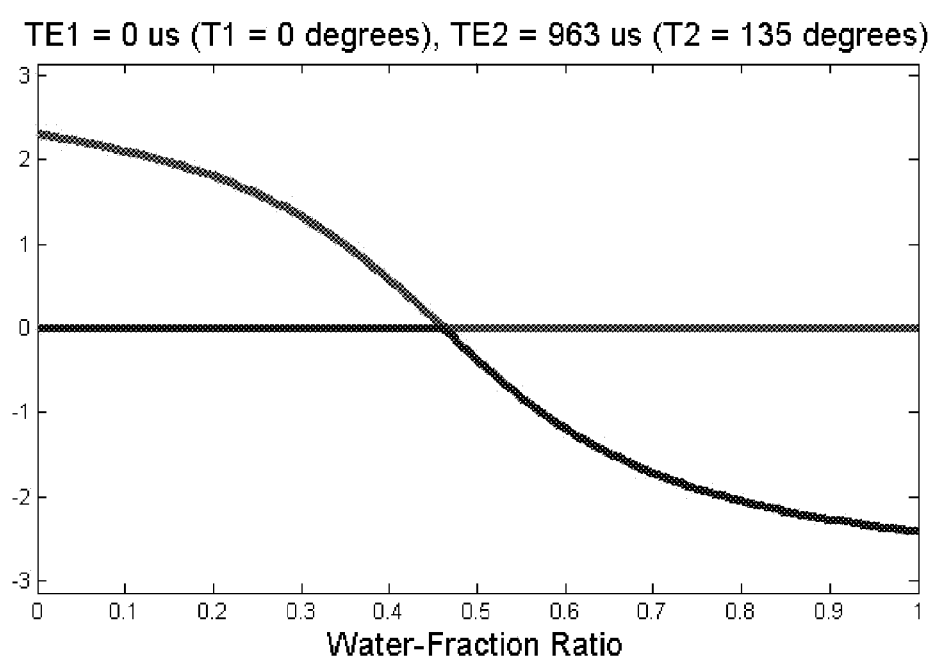
FIGS. 4B-4F are graphs that display the relative angle is plotted as a function of Q for a few representative combinations of $TE_1$ and $TE_2$.
Figure 4C:
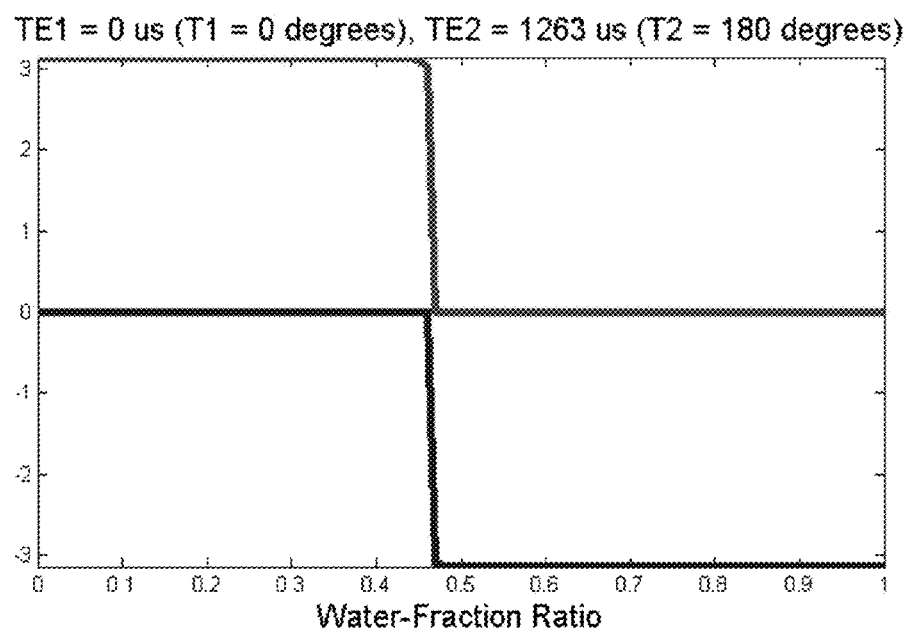
Figure 4D:
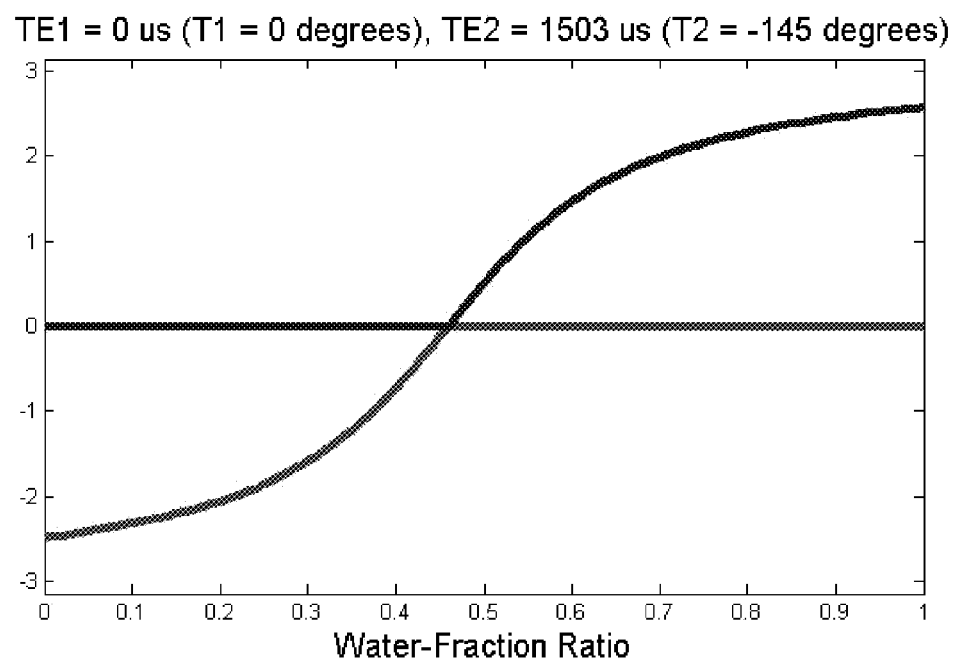
Figure 4E:
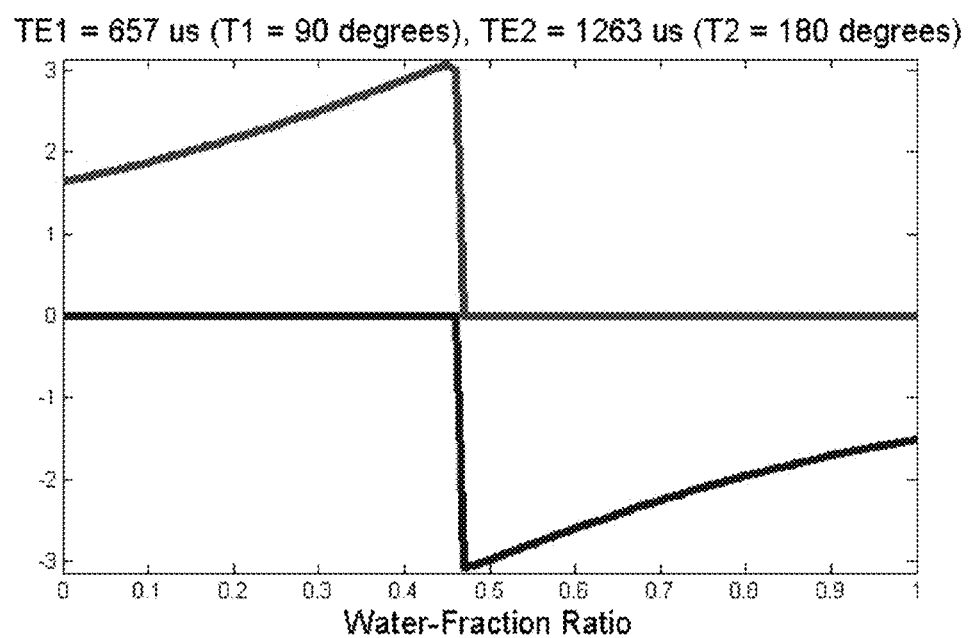
Figure 4F:
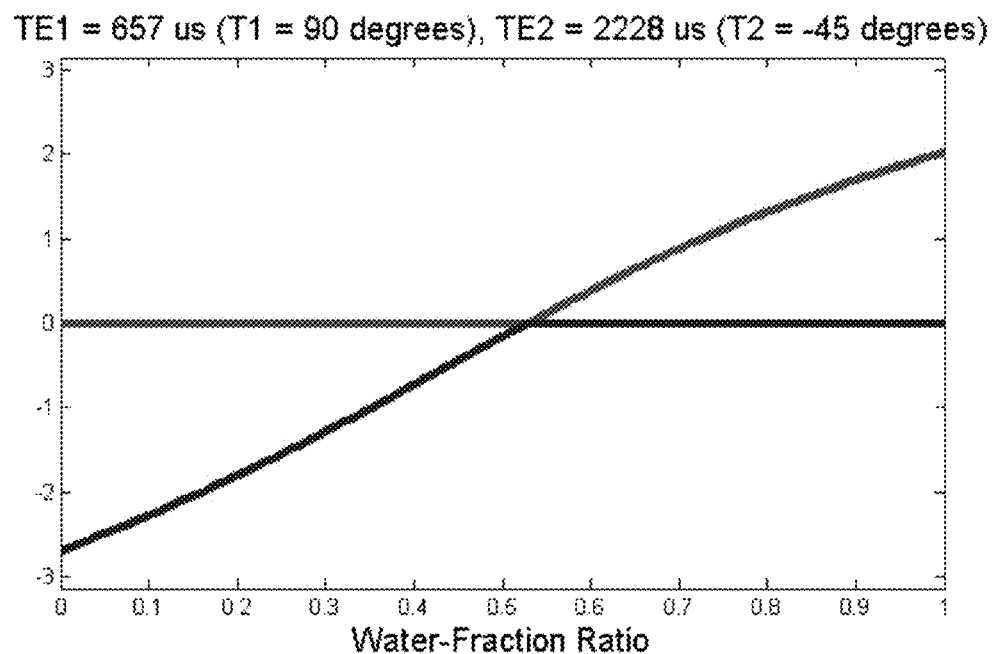

To clarify the rationale for joint consideration of the correct and incorrect vectors in the region growing, FIG. 4A displays the relative angle of the incorrect input vector with respect to the correct input vector as a function of $TE_1$, $TE_2$, and Q. The two vectors are calculated according to Eqs. [21-22], and the fat signal used in the calculation is simulated as a function of $TE_1$ and $TE_2$ by assuming a magnetic field strength of 3.0T and a previously published multiple peak spectrum for fat. For a given combination of $TE_1$ and $TE_2$, the relative angle in general varies smoothly with Q. In particular, the angle changes the sign around the mid-point, where Q changes from being less than 0.5 (fat-dominant) to being greater than 0.5 (water-dominant). In FIGS. 4B-4F, the relative angle is plotted as a function of Q for a few representative combinations of $TE_1$ and $TE_2$. Importantly, the function is in general approximately antisymmetric with respect to the zero-crossing point at Q of approximately 0.5. Therefore, the orientation of the incorrect vector is expected to be smooth when two neighboring pixels both are either water dominant or fat dominant. When one of the two neighboring pixels is water dominant and the other is fat dominant, we expect that the orientation of the incorrect vector is smooth after the incorrect vector of one of the two pixels is mirror-reflected with respect to the correct vector, as in FIG. 3. Since the orientation of the correct vector is always smooth independent of Q, the minimum of the three angular differences in Eqs. [25-27] will correspond to the angular difference obtained when the correct vector of the pixel is paired with the correct vector reference, regardless of how Q changes for a pixel. In contrast to comparing and selecting only one vector of the pixel with one reference vector as commonly used in all the exist phase correction algorithms, the joint consideration of both the correct and the incorrect vectors takes into account the expected relative angular difference between the incorrect vector and the correct vector of a given pixel and therefore is expected to be more robust with respect to noise and other fluctuations.

FIGS. 5-8 illustrate images obtained in different steps of the methods according to the present disclosure (including, for example, the steps provided in FIG. 2) during processing of an image. The images are acquired with both echo times being flexible and substantially different from the conventional in-phase or out-of-phase echo times.

Figure 5A:
FIGS. 5A-5B are examples of separated abdominal water and fat images.
Figure 5B:
Figure 5C:
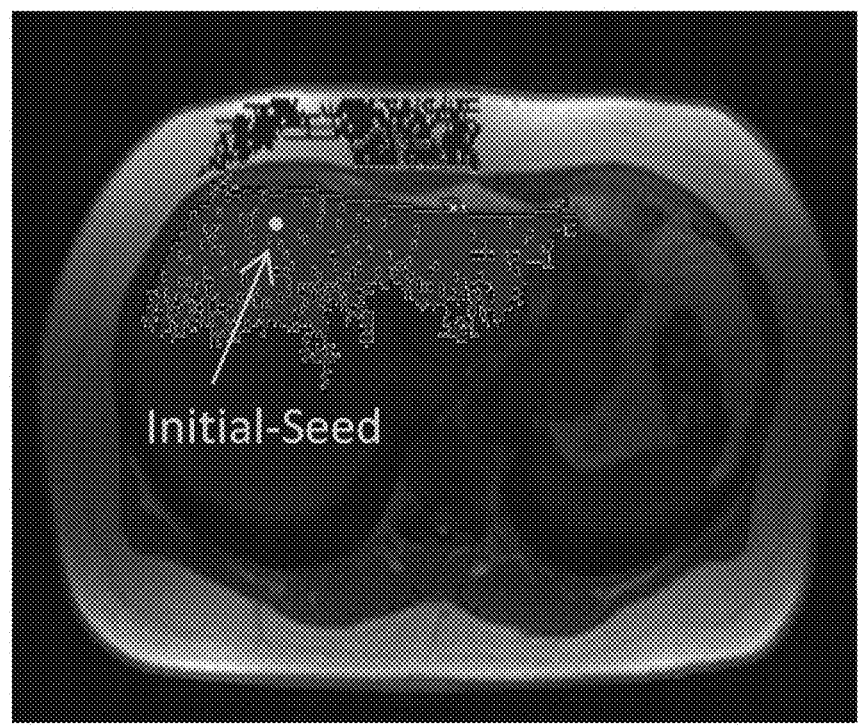
FIG. 5C illustrates an image in which the initial seed pixel was selected from a water-dominant region in a liver.
Figure 5D:
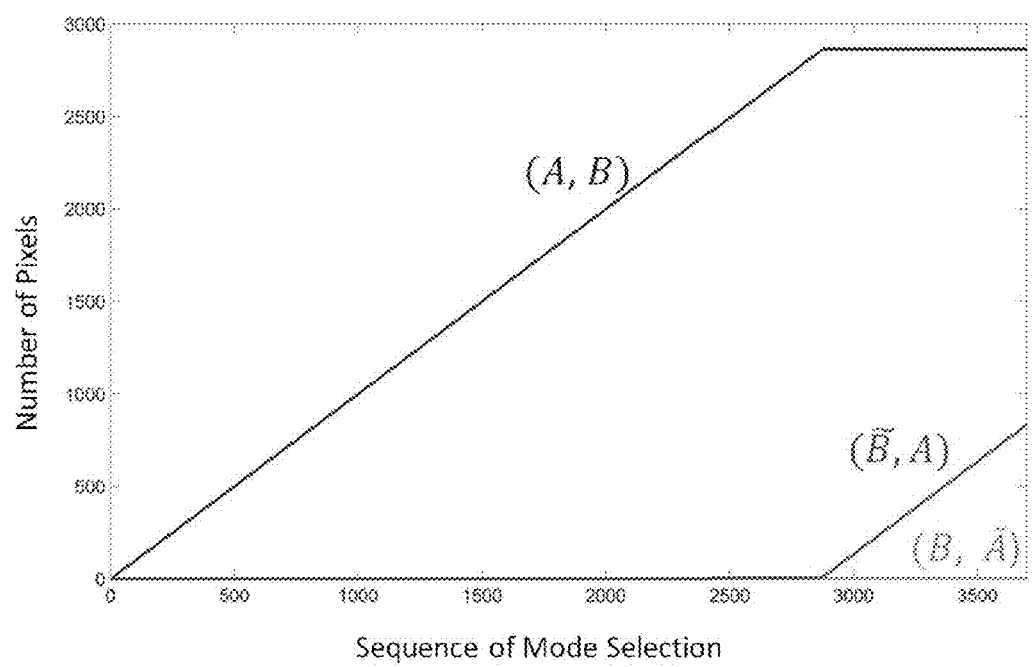
FIG. 5D illustrates an image in which the region growing proceeded within the liver.

FIGS. 5A-5B show an example of separated abdominal water and fat images acquired at 3T and at $TE_1$ and $TE_2$ of 1.42 ms and 3.02 ms, respectively. Using a predetermined multiple peak model for fat, the corresponding $(\delta_1, \delta_2)$ and $(\theta_1, \theta_2)$ were calculated to be (0.86, 0.62) and (−158°, 74°), respectively. In this case, the initial seed pixel was selected from a water-dominant region in the liver (FIG. 5C). As region growing proceeded within the liver, the majority of the pixels had (A, B) as their updated vector pair (FIG. 5D). When region growing crossed into a fat-dominant region (FIG. 5C), the dominant number of pixels selected (B̃, A) as their updated vector pair. Based on this recorded information, the mode of region growing changed from step 204a to step 204b (FIG. 2) for the remaining processing. Further, the region growing process was able to unequivocally select B as the correct vector for all the updated pixels, which effectively identified water and fat after their separation.

Figure 6A:
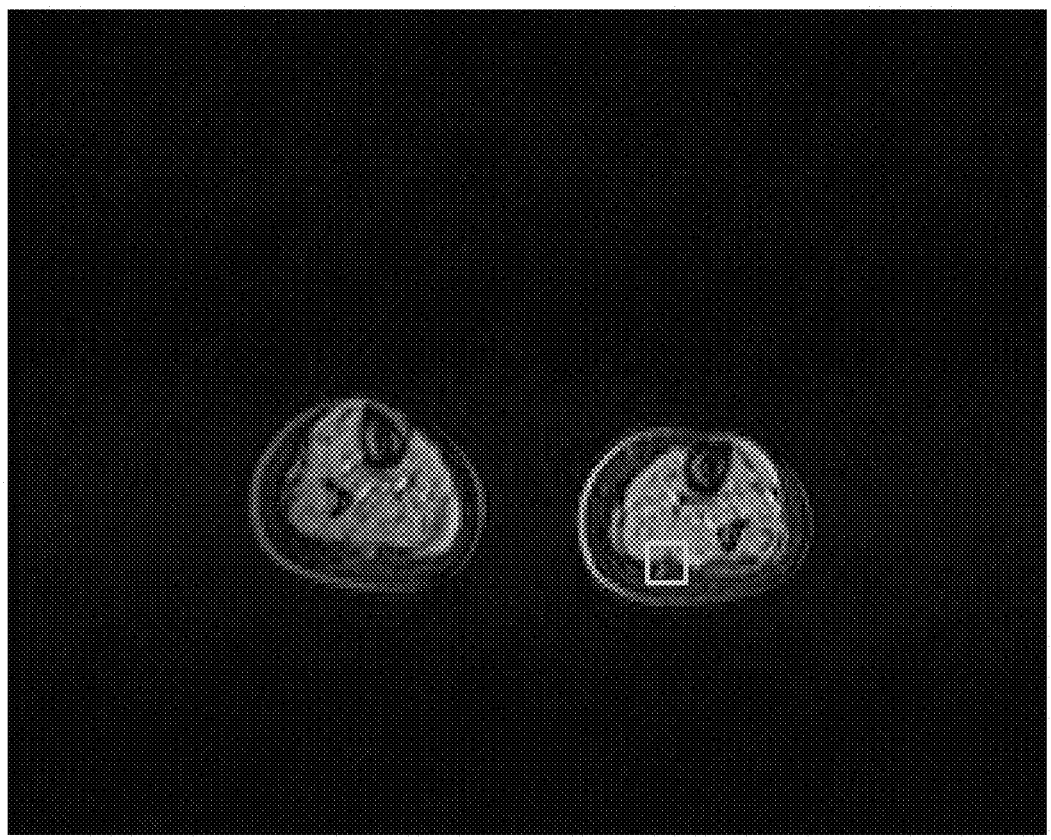
FIGS. 6A-6B illustrate water-only and fat-only images of an axial slice of two legs.
Figure 6B:
Figure 6C:
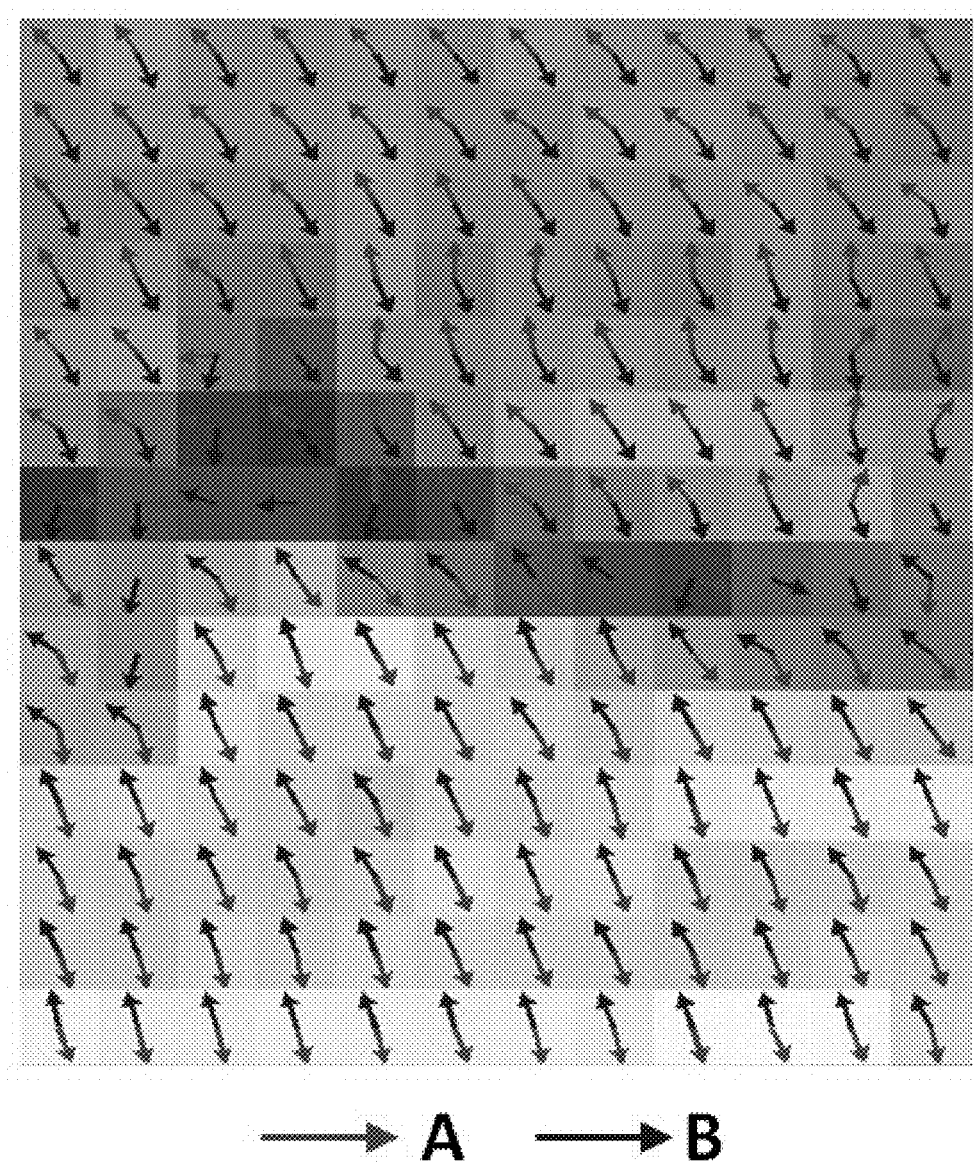
FIG. 6C illustrates the distribution of two candidate vectors before phase correction for regions in FIGS. 6A-6B.
Figure 6D:
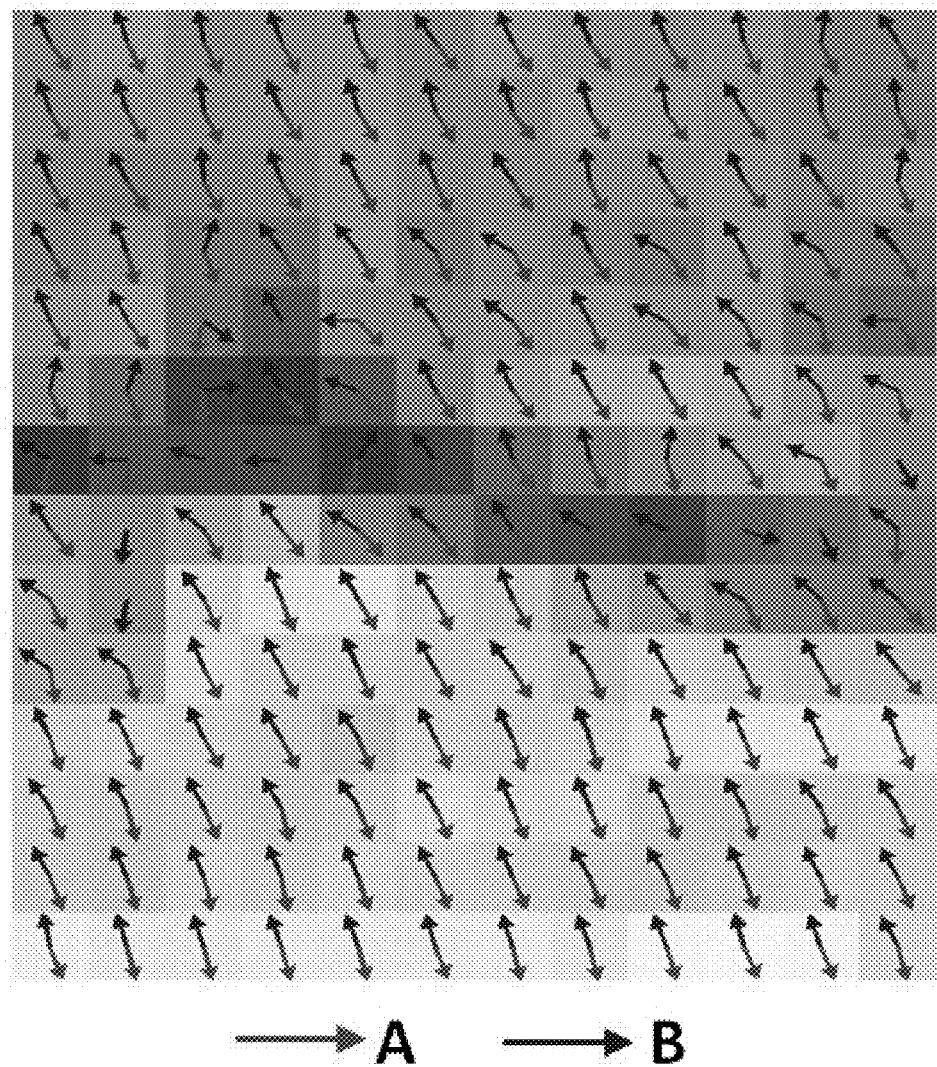
FIG. 6D illustrates the distribution of the two vectors after region growing for the region showing
Figure 6E:
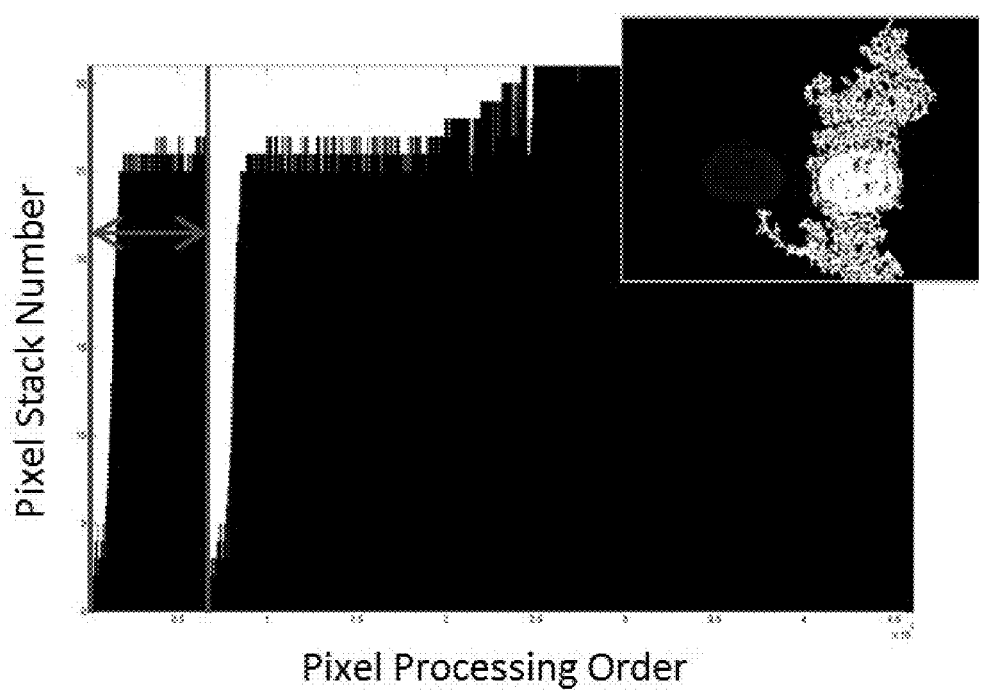
Figure 6F:
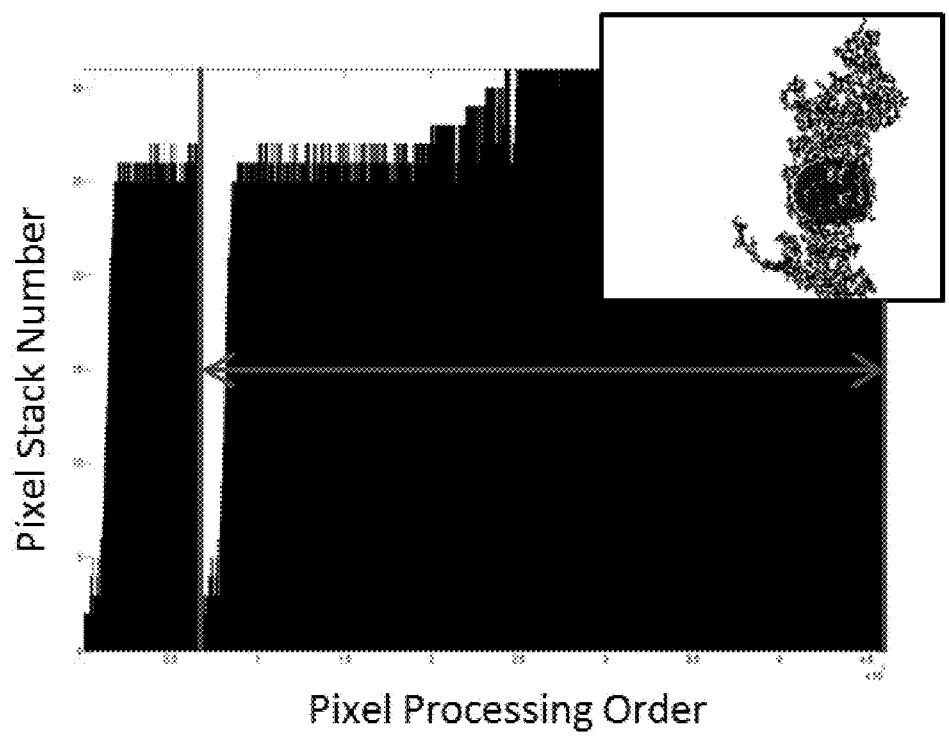

FIG. 6A-6B shows the water-only and fat-only images of an axial slice of two legs. The original images were acquired at 1.5T and at $TE_1$ and $TE_2$ of 2.2 ms and 4.58 ms, respectively. Using a predetermined multiple peak model for fat, the corresponding $(\delta_1, \delta_2)$ and $(\theta_1, \theta_2)$ were calculated to be (0.86, 0.79) and (156°, −36°), respectively. FIG. 6C shows the distribution of the two candidate vectors before phase correction for a small region (indicated by yellow boxes in FIGS. 6A-6B) that encompasses both a water-dominant area and a fat-dominant area. FIG. 6D shows the distribution of the two vectors after region growing for the same region. FIGS. 6E-6F shows the recorded sequence of the priority order of the pixels as they were being processed for region growing. Based on this recorded priority order sequence, the algorithm easily detected the start of a new tissue region after processing the pixels from one leg and some background pixels (FIG. 6E). The algorithm was then able to start a new thread of region growing to process the new tissue region (FIG. 6F), thus ensuring that the two isolated tissue regions were phase-corrected consistently.

Figure 7A:
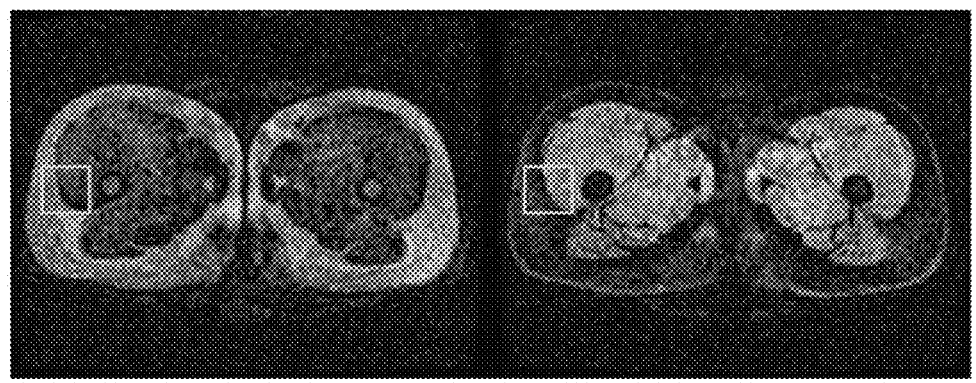
FIGS. 7A-7B illustrate separated water and fat images produced when only one vector was considered.
Figure 7B:
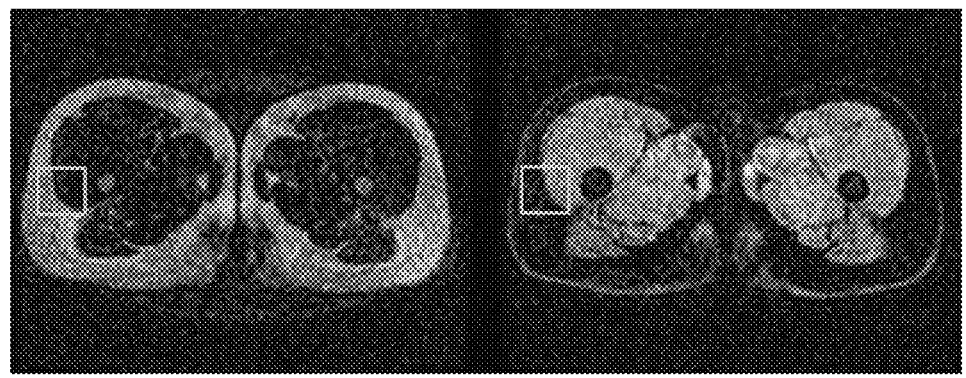
Figure 7C:
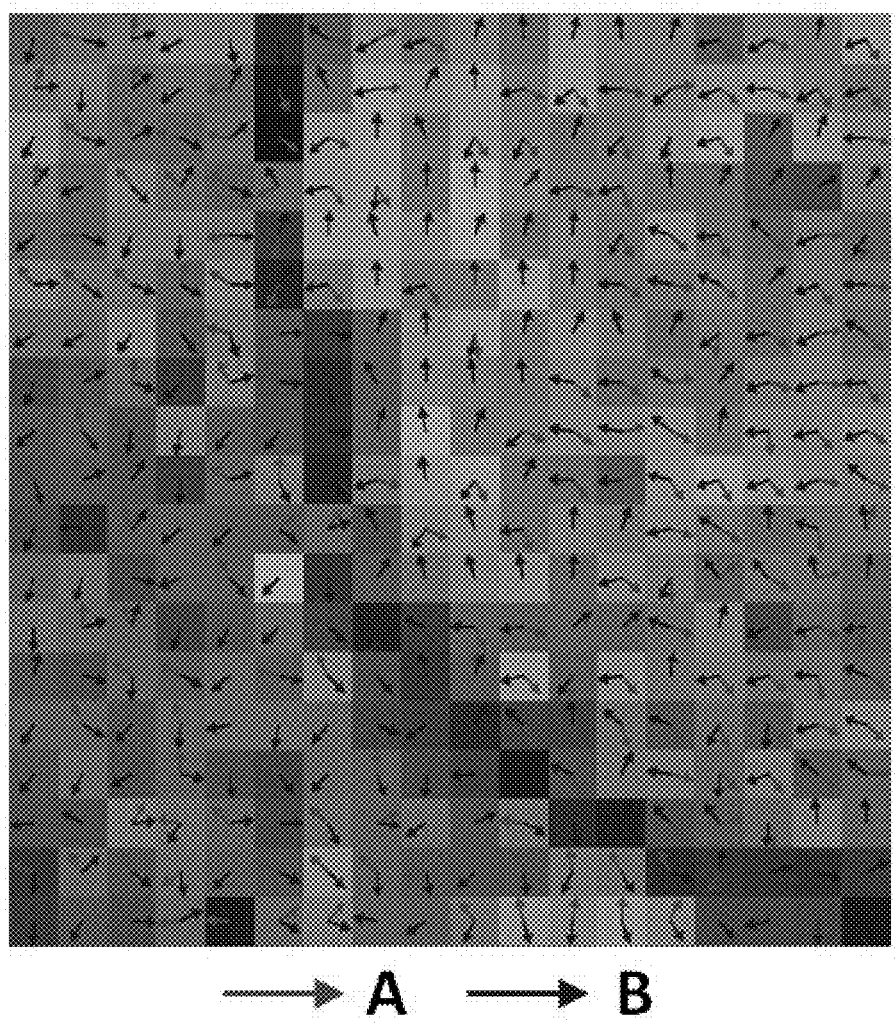
FIG. 7C illustrates the distribution of two candidate vectors before phase correction from a region of FIGS. 7A-7B.
Figure 7D:
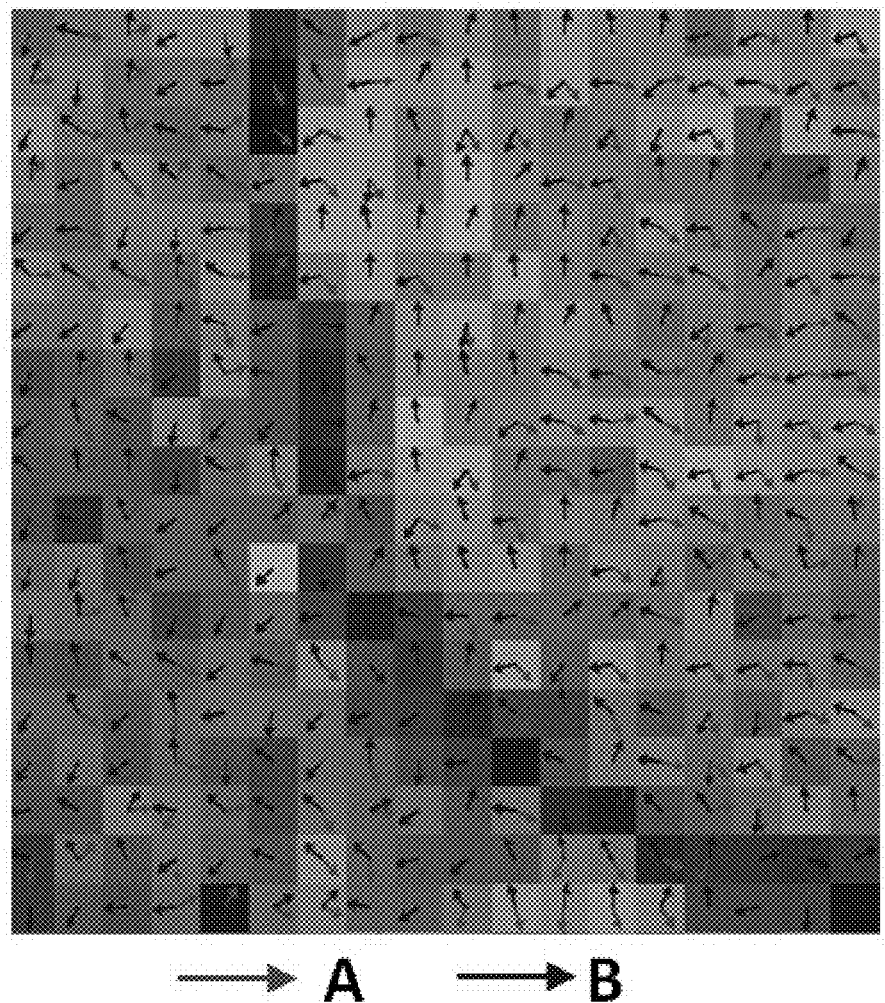
FIG. 7D illustrates output vector distributions obtained when only one vector was considered.
Figure 7E:
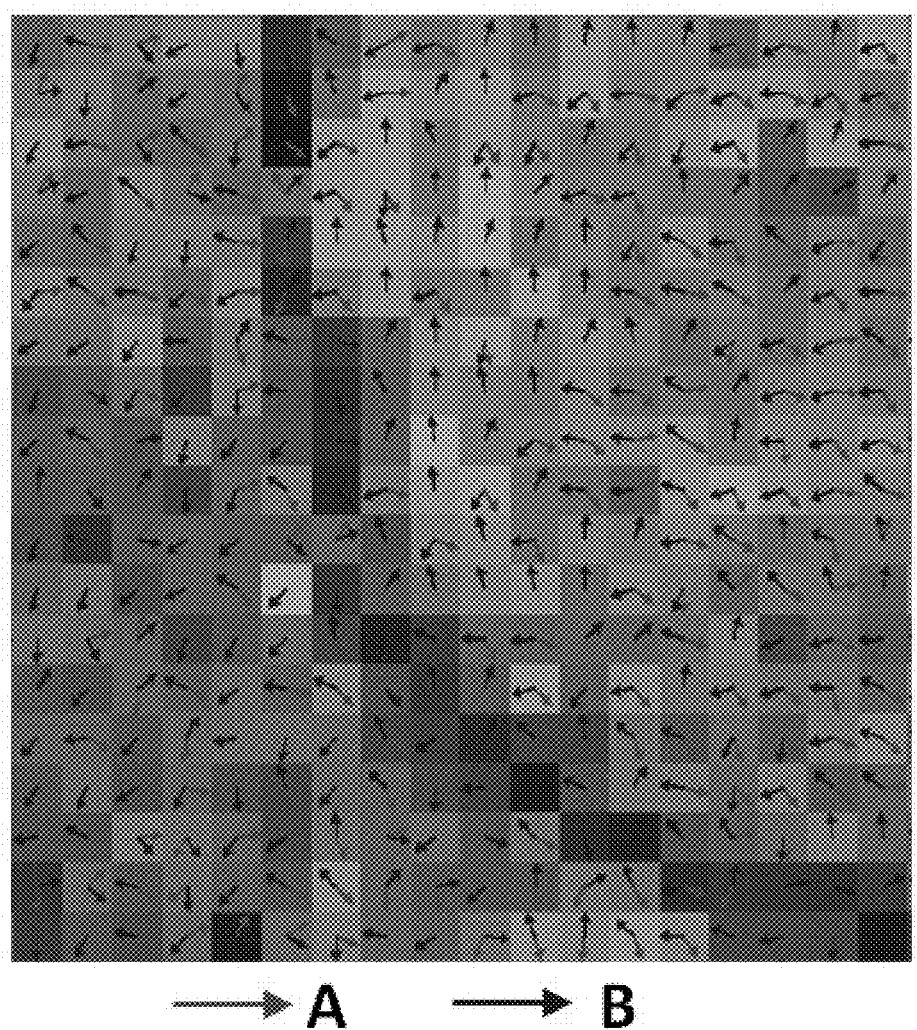
FIG. 7E illustrates output vector distributions obtained when two candidate vectors were considered

FIGS. 7A-7B show the separated water and fat images produced when only one vector was considered (as in all the previously-known approaches for phase correction) and when two candidate vectors were jointly considered (the proposed approach) in the region growing process. The images were of a fairly low SNR and were acquired at 1.5T and at $TE_1$ and $TE_2$ of 1.2 ms and 3.2 ms, respectively. The corresponding $(\delta_1, \delta_2)$ and $(\theta_1, \theta_2)$ were (0.92, 0.86) and (85°, −131°), respectively. The distribution of the two candidate vectors before phase correction from a small region (indicated by yellow boxes in FIG. 7A-7B) is shown in FIG. 7C. The corresponding output vector distributions obtained when only one vector was considered and when two candidate vectors were jointly considered are shown in FIGS. 7D and 7E, respectively. Comparison of the output vector distributions and the corresponding separated water and fat images demonstrates that joint consideration of the two candidate vectors yielded more reliable and consistent phase correction and cleaner water and fat separation.

In addition to the signal modeling inaccuracy, other deviations, such as those stemming from noise, artifacts, or any potential image reconstruction errors before phase correction, may result in some non-physical water fraction $Q_{1,2}$ in Eq. [10], as when $a_3$ in Eq. [13] becomes negative. Such ill-conditioning can be exaggerated when non-optimal echo times $TE_1$ and $TE_2$ are used for acquistion.

Figure 8A:
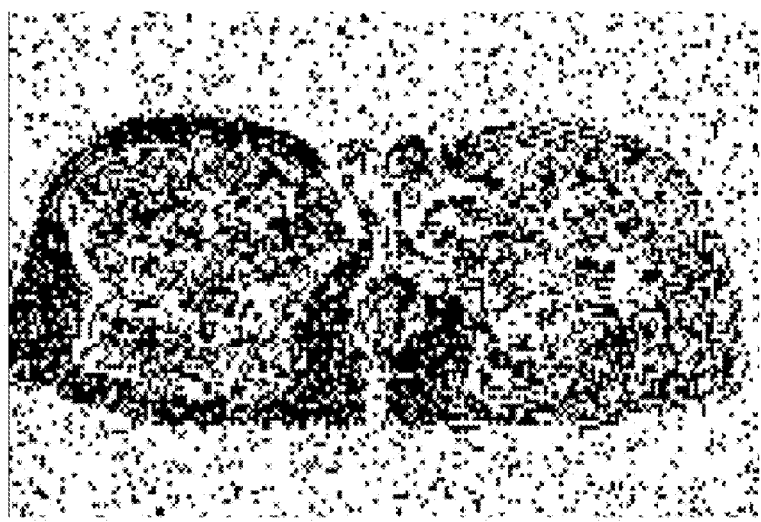
FIG. 8A-8C illustrate processing of an image set that was acquired at 1.5T and at echo times $TE_1$ and $TE_2$ of 1.25 ms and 3.9 ms, respectively
Figure 8B:
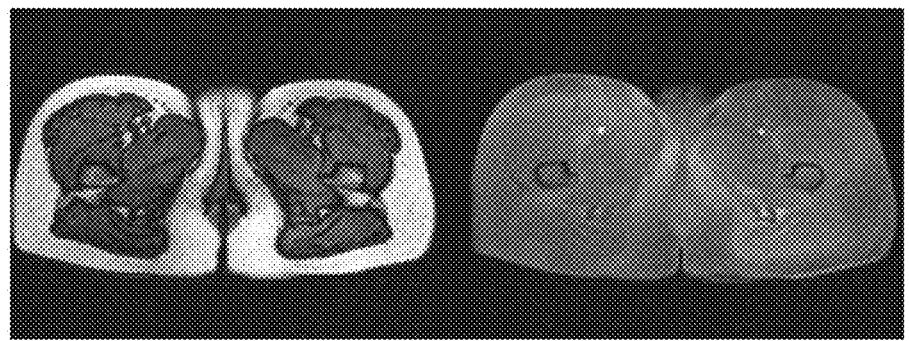
Figure 8C:
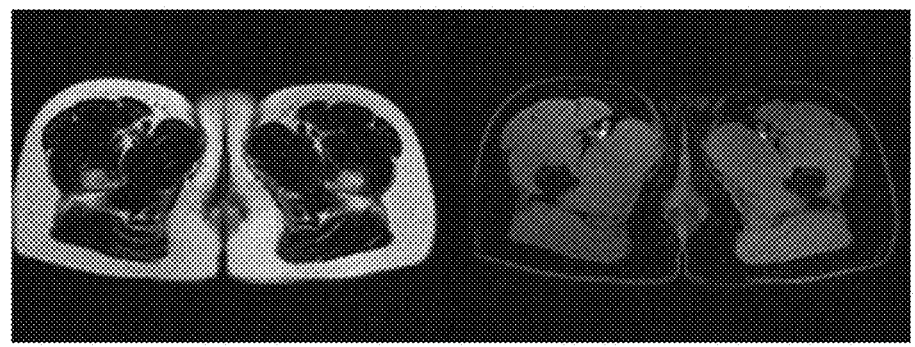

FIGS. 8A-8C shows processing of an image set that was acquired at 1.5T and at echo times $TE_1$ and $TE_2$ of 1.25 ms and 3.9 ms, respectively. The corresponding $(\delta_1, \delta_2)$ and $(\theta_1, \theta_2)$ were (0.93, 0.85) and (85°, −83°), respectively. FIG. 8A shows a map of pixels that have a non-physical water fraction (i.e., is imaginary, less than 0 or greater than 1) calculated according to Eq. [13]. FIG. 8B shows poorly separated water and fat images that were obtained when the input vectors were calculated according to Eqs. [19-20] for phase correction. FIG. 8C shows separated water and fat images of the same data after phase correction using the alternative input vectors that were calculated according to Eqs. [23-24]. Because Eqs. [23-24] avoided the problem of ill-conditioning in Eqs. [10-20], much better water and fat separation was achieved in FIG. 8c than in FIG. 8B.

Any type of MRI image or images may be subjected to image processing steps shown in FIG. 2, or those disclosed herein. Again, a suitable MRI image or images may involve two point Dixon water and fat images that are acquired using flexible echo times. Image processing steps 201-207 may be performed by—and may be integrated with, either by hardware or software any suitable MRI system, including commercially available systems. Similarly the processing steps of this disclosure may be implemented on a non-transitory computer readable storage—medium as an executable program that instructs a microprocessor to perform the steps.

The optimized region growing-based phase correction strategy can be implemented as a fully automatic solution, and it is capable of robust water and fat separation using two input images with flexible echo times. Because of this increased flexibility, note that the less-efficient dual-echo image acquisition with unipolar flyback readout gradients may be used as a practical alternative to the more-efficient bipolar acquisition for its advantage of having no off-resonance related spatial mis-registration between the two input images along the frequency-encode direction.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements. For example, different schemes of selecting the initial seed pixel or pixels and assigning the value of the updated correct and incorrect vectors for these initial seed pixels may be employed; Different ways of calculating the vector images A and B are possible and can be used for the two point Dixon imaging with flexible echo times or other phase sensitive magnetic resonance imaging applications; The phase correction algorithm with the optimized region growing can also be easily extended to applications in which more than two vectors images (e.g., A, B, C) need to be considered to construct a final vector image O that is used for phase correction; Calculation of an estimated O for a pixel may be performed using more complicated method beyond a $0^{th}$ order or $1^{st}$ order estimation; Additionally, calculation of the vector images A and B may be explicit or implicit, and the two vector images may be weighted differently as described herein.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program, computing device program, and/or software, as used herein, is defined as a sequence of instructions designed for execution on a computer system. A program may include, for example, a subroutine, a function, a procedure, an object method, an object implementation, and an executable application and/or other sequence of instructions designed for execution on a computer system.

REFERENCES

The following references, and any reference mentioned in this application, are herein incorporated by reference in full:
1. Ma J. MRM 2004; 52(2):415-419.
2. Ma J, et al. JMRI 2006; 23(1):36-41.
3. Xiang Q S. MRM 2006; 56(3):572-584.
4. Eggers H, et al. ISMRM, 2010. p. 770.
5. Eggers H. ISMRM 2010. p. 2924.
6. Berglund et. al., Magnetic Resonance in Medicine 65:994-1004 (2011)
7. U.S. Pat. No. 7,227,357
8. U.S. Pat. No. 7,227,359
9. U.S. Pat. No. 7,888,936
10. Eggers H, et al., Magnetic Resonance in Medicine 65(1):96-107, 2011.

The invention claimed is:

1. A computerized method for generating a phase corrected magnetic resonance image comprising:
   (a) acquiring a first magnetic resonance image containing error and intrinsic phase information;
   (b) calculating two or more candidate input vector images from the acquired image; and
   (c) performing an optimized region growing based phase correction algorithm to determine an output vector image that is spatially smooth in orientation and is substantially represented at each pixel by one of the calculated vector images at the same pixel, wherein phase correction is performed by:
      selecting an initial seed pixel for a new thread of region growing and placing the initial seed pixel onto a highest priority pixel stack;
      selecting a pixel that is placed on a pixel stack with a highest priority order from a list of pixel stacks that hold unprocessed pixels;
      determining an updated vector pair for the selected pixel by jointly considering its input vector pair (A and B) with a reference vector pair ($A_r$ and $B_r$);
      placing each of neighboring pixels of the selected pixel onto one of pixel stacks according to a quality metric by jointly comparing an input vector pair of a neighbor pixel with a reference vector pair;
      recording and monitoring the priority and the mode of region growing for the selected pixel;
      using the recorded mode of region growing to determine which vector pairs need to be considered and which vector of the updated vector pair is a correct vector; and
      performing a final pixel-level optimization in which a vector O of a pixel is assigned as its original input vector A or B depending on if A or B has a smaller angular difference with the locally average O of the pixel over a selected boxcar.

2. The computerized method of claim 1 wherein performing an optimized region growing based phase correction algorithm comprises:
   calculating a first candidate input vector map A and a second candidate input vector map B from the first magnetic resonance image;
   generating an updated vector pair (A and B) for a given pixel jointly by comparing the angular differences of A and B, B and Ã, B̃ and A, of a given pixel with a reference vector pair ($A_r$ and $B_r$) for the same pixel;
   deciding the order by which a pixel is visited by the region growing using a quality metric based on the angular differences of A and B, B and Ã, B̃ and A, of the pixel with a reference vector pair ($A_r$ and $B_r$) for the same pixel;
   calculating the reference vector pair ($A_r$ and $B_r$) for a given pixel as the updated vector pair A and B averaged over all the pixels that have been previously processed by the region growing and are located within a boxcar neighborhood of the given pixel;

determining the mode of region growing by recording and monitoring the number of pixels selecting each of the three possible vector pairs (A and B, B̃ and A, B and Ã) as their updated vector pair A and B, wherein Ã is the mirror vector of A with respect to B and B̃ is the mirror vector of B with respect to A;

using the mode of region growing to select the correct vector O from the updated vector pair A and B; and detecting spatially isolated tissue regions and starting new threads of region growing by recording and monitoring the quality of region growing.

3. The method of claim 1 further comprising:

(e) generating the phase corrected magnetic resonance image or images from the acquired magnetic resonance image or images using a final output vector O to remove the error phase; and (f) displaying or archiving the phase corrected magnetic resonance image or images.

4. The method of claim 1 further comprising:

(g) selecting a seed pixel or pixels and assigning A and B of the seed pixel or pixels as the updated vector pair A and B for the seed pixel or pixels;

(h) selecting a second seed pixel from a pixel stack and determining its updated vector pair A and B jointly as its A and B, or B and Ã, or B̃ and A, wherein Ã is the mirror vector of A with respect to B, and B̃ is the minor vector of B with respect to A, depending on which of the three vector pairs has the smallest angular difference with a reference vector pair for the updated vector pair A and B of the second seed pixel;

(i) determining for the second seed pixel a local quality metric for each of nearest neighbor pixels of the second seed pixel for which the updated vector pair A and B have not been determined and assigning a priority to each of the nearest neighbor pixels using the local quality metric in order to determine the sequence by which each of the nearest neighbor pixels is to be selected as a further seed pixel; and (j) repeating the steps of (h) and (i) to complete optimized region growing with respect to further seed pixels and to construct the updated vector image pair A and B for all pixels that are processed by the optimized region growing, wherein:

an initial seed pixel or pixels are placed onto a high priority pixel stack or stacks among a series of pixel stacks that are initially empty and which facilitate a sequencing of the optimized region growing;

a pixel is selected as a seed pixel if it has not been processed previously as a seed pixel and it is on a pixel stack that has a highest priority among pixel stacks that contain at least one pixel that has not been processed as a seed pixel; and the local quality metric of a pixel is calculated as the smallest of the angular differences of A and B, B and Ã, B̃ and A, of the pixel with an estimated reference vector pair $A_r$ and $B_r$ for the same pixel.

5. The method of claim 4, wherein the values of the vector A and vector B for an initial seed pixel are assigned as the updated vector pair A and B for the initial seed pixel, and an optimized region growing is performed to jointly construct an updated vector pairs A and B for all the pixels processed by the region growing, wherein a final correct vector O is selected by recording and monitoring the mode of region growing of the processed pixels.

6. The method of claim 4 wherein acquiring the magnetic resonance image comprises acquiring two-point Dixon water and fat images, wherein a first image $S_1$ is acquired at a first echo time TE1 and a second image $S_2$ is acquired at a second echo time TE2.

7. The method of claim 6, wherein the images $S_1$ and $S_2$ are expressed according to the following equations:

$$S_1 = (W + \delta_1 F e^{i\theta_1}) P_1$$

$$S_2 = (W + \delta_2 F e^{i\theta_2}) P_1 P$$

where W and F are amplitudes for water and fat respectively, $P_1$ is a phase factor of image $S_1$, P is an additional phase factor of image $S_2$ relative to image $S_1$ and is determined by a background or error phase, and the method further comprises determining an amplitude attenuation factor ($\delta_1$, $\delta_2$) and phase ($\theta_1$, $\theta_2$) as a function of two echo times (TE1, TE2) using a known or pre-calibrated fat signal model.

8. The method of claim 6, wherein the images $S_1$ and $S_2$ are used to generate two vector images A and B as expressed according to the following equations:

$$A = S^*_1 S_2 [Q_A + \delta_1(1-Q_A)e^{i\theta_1}]/[Q_A + \delta_2(1-Q_A)e^{-i\theta_2}]$$

$$B = S^*_1 S_2 [Q_B + \delta_1(1-Q_B)e^{i\theta_1}]/[Q_B + \delta_2(1-Q_B)e^{-i\theta_2}]$$

where $Q_A$ and $Q_B$ are the two mathematically possible solutions of the following quadratic equation of Q, which is defined as $$Q = \frac{W}{W+F}$$

(the water fraction for a given pixel):

$$[(1+\delta_2^2 - 2\delta_2 \cos\theta_2)M_1 - (1+\delta_1^2 2\delta_1 \cos\theta_1)M_2]Q^2 - 2[(\delta_2^2 - \delta_2 \cos\theta_2)M_1 - (\delta_1^2 - \delta_1 \cos\theta_1)M_2]Q + [(M_1\delta_2^2 - M_2\delta_1^2)] = 0$$

where $M_1$ and $M_2$ are the square of the amplitudes of the images $S_1$ and $S_2$, respectively ($M_1 = |S_1|^2$ and $M_2 = |S_2|^2$).

9. The method of claim 8, wherein the vector images are further normalized and weighted by a signal amplitude:

$$A' = \frac{A}{|A|}\sqrt{M_1 + M_2}$$

$$B' = \frac{B}{|B|}\sqrt{M_1 + M_2}$$

where $M_1 = |S_1|^2$ and $M_2 = |S_2|^2$.

10. The method of claim 9, wherein an optimized region growing algorithm is used to jointly construct an updated vector image pair A and B from the two input vector images A and B and a final vector image O is selected for phase correction, wherein:

final vector image O is selected based on the region growing mode and used to phase correct and remove the phase factor P from the image $S_2$, the phase corrected $S_2$ is combined with $S_1$ to solve for $WP_1$ and $FP_1$, and then to generate a water-only image and a fat-only image according to the following equations:

$$W = \text{Real}\{(WP_1)\overline{WP_1}^*/|\overline{WP_1}|\}$$

$$F = \text{Real}\{(FP_1)\overline{FP_1}^*/|\overline{FP_1}|\}$$

where Real{ . . . } is to take the real component of its complex argument, * is to take the complex conjugate of its argument, and $\overline{WP_1}$ and $\overline{FP_1}$ represent low-pass filtering of $WP_1$ and $FP_1$, respectively.

11. The method of claim 6, wherein one of the images is acquired at an echo time when water and fat are substantially in-phase, such as in a spin echo or fast spin echo pulse sequence.

12. The method of claim 11, wherein images $S_1$ and $S_2$ are expressed according to the following equations:

$$S_1 = (W+F)P_1$$

$$S_2 = (W+\delta F e^{i\theta})P_1 P$$

where W and F are amplitudes for water and fat respectively, $P_1$ is a phase factor of image $S_1$, P is an additional phase factor of image $S_2$ relative to image $S_1$ and is determined by a background or error phase, and the method further comprises determining an amplitude attenuation factor $\delta$ and phase $\theta$ as a function of the echo time TE2 relative to the echo time TE1 using a known or pre-calibrated fat signal.

13. The method of claim 6, wherein the images $S_1$ and $S_2$ are used to generate two vector images A and B as expressed according to the following equations:

$$A' = S^*_1 S_2 (W_1 + \delta F_1 e^{-i\theta})$$

$$B' = S^*_1 S_2 (W_2 + \delta F_2 e^{-i\theta})$$

where $W_1$, $F_1$ and $W_2$, $F_2$ are the two sets of algebraic solutions to the following equations:

$$I_1 = W + F$$

$$I_2^2 = W^2 + \delta^2 F^2 + 2\delta WF \cos\theta$$

where $I_1 = |S_1|$ and $I_2 = |S_2|$.

14. The method of claim 1 wherein acquiring a magnetic resonance image or images comprises acquiring a single-point Dixon water and fat image wherein a flexible echo time TE is used and the acquired magnetic resonance image is expressed as: $S = (W + Fe^{i\theta})P$, where $\theta$ is dependent on TE and the dependence is determined a known or pre-calibrated fat signal model, and P ($\equiv e^{i\phi}$) is a phase factor for the image S.

15. The method of claim 14, wherein the vector image A is set to S and the vector image B is set to $Se^{-i\theta}$.

16. The method of claim 15, wherein an optimized region growing algorithm is used to jointly construct an updated vector pair A and B from the two input vector images A and B, and a final vector image O is selected to phase correct or remove P from S to form S', and a water-only image and a fat-only image are generated according to:

$$F = \mathrm{Imag}\{S'\}/\sin\theta$$

$$W = \mathrm{Real}\{S' - F\cos\theta\}$$

where Real{ . . . } and Imag{ . . . } are to take the real and imaginary components of their component, respectively.

17. The method of claim 1, wherein acquiring a magnetic resonance image or images comprises acquiring a single-point silicone specific image wherein an echo time TE when water and fat signals are substantially in-phase is used, and the acquired magnetic resonance image is expressed according to the following equation:

$$S = (W + F + I e^{i\theta})P$$

where $\theta$ is determined with an image-based pre-calibration for the echo time TE as a phase discontinuity of a known silicone-only image region and a neighboring known water or fat only image region, and P ($\equiv e^{i\phi}$) is a phase factor for the image S.

18. The method of claim 17, wherein vector image A is set to S and vector image B is set to $Se^{-i\theta}$.

19. The method of claim 18, wherein an optimized region growing algorithm is used to jointly construct an updated vector pair A and B from the two input vector images A and B, and a final vector image O is selected and used to phase correct or remove P from S to form S', and a silicone-only image and a silicone-suppressed image are generated according to:

$$I = \mathrm{Imag}\{S'\}/\sin\theta$$

$$W + F = \mathrm{Real}\{S' - I\cos\theta\}$$

where Real{ . . . } and Imag{ . . . } are to take the real and imaginary components of their component, respectively.

20. A system for generating a phase corrected magnetic resonance image or images comprising:
 (a) a magnetic resonance imaging controller;
 (b) a processor coupled to the controller and configured to execute phase correction instructions applicable to a magnetic resonance image or images, wherein the instructions comprise:
  (i) calculating a first input vector map A and a second input vector map B from the first magnetic resonance image;
  (ii) determining an updated vector pair for a selected pixel by jointly considering its input vector pair (A and B) with a reference vector pair ($A_r$ and $B_r$);
  (iii) placing each of neighboring pixels of the selected pixel onto one of pixel stacks according to a quality metric by jointly comparing an input vector pair of a neighbor pixel with a reference vector pair;
  (iv) performing a final pixel-level optimization in which a vector O of a pixel is assigned as its original input vector A or B depending on if A or B has a smaller angular difference with the locally average O of the pixel over a selected boxcar;
  (v) generating a phase corrected magnetic resonance image or images from the acquired magnetic resonance image or images using the final output vector O; and
  (vi) displaying or archiving the phase corrected magnetic resonance image or images; and
 (c) an output or storage device configured to display or store the phase corrected magnetic resonance image or images.

21. A non-transitory computer readable storage medium with an executable program stored thereon, wherein the program instructs a microprocessor to perform steps comprising:
 (a) calculating a first input vector map A and a second input vector map B from a first magnetic resonance image;
 (b) determining an updated vector pair for a selected pixel by jointly considering its input vector pair (A and B) with a reference vector pair ($A_r$ and $B_r$);
 (c) placing each of neighboring pixels of the selected pixel onto one of pixel stacks according to a quality metric by jointly comparing an input vector pair of a neighbor pixel with a reference vector pair;
 (d) performing a final pixel-level optimization in which a vector O of a pixel is assigned as its original input vector A or B depending on if A or B has a smaller angular difference with the locally average O of the pixel over a selected boxcar;
 (e) selecting a final output vector O to be used for phase correction for each pixel, wherein the final output vector O is selected by using a recorded region growing mode;

(f) generating a phase corrected magnetic resonance image or images from an acquired magnetic resonance image or images using the final output vector O; and
(g) displaying or archiving the phase corrected magnetic resonance image or images.

\* \* \* \* \*